United States Patent
Osaka et al.

(10) Patent No.: US 11,215,673 B2
(45) Date of Patent: Jan. 4, 2022

(54) GROUP BATTERY, BATTERY MODULE, AND METHOD FOR EVALUATING BATTERY MODULE

(71) Applicants: WASEDA UNIVERSITY, Tokyo (JP); TOYOTA JIDOSHA KABUSHIKI KAISHA, Aichi-ken (JP)

(72) Inventors: Tetsuya Osaka, Tokyo (JP); Tokihiko Yokoshima, Tokyo (JP); Daikichi Mukoyama, Tokyo (JP); Hiroki Nara, Tokyo (JP)

(73) Assignee: WASEDA UNIVERSITY, Tokyo (JP)

(*) Notice: Subject to any disclaimer, the term of this patent is extended or adjusted under 35 U.S.C. 154(b) by 183 days.

(21) Appl. No.: 16/344,986

(22) PCT Filed: Apr. 3, 2018

(86) PCT No.: PCT/JP2018/014340
§ 371 (c)(1),
(2) Date: Apr. 25, 2019

(87) PCT Pub. No.: WO2018/186423
PCT Pub. Date: Oct. 11, 2018

(65) Prior Publication Data
US 2019/0271747 A1     Sep. 5, 2019

(30) Foreign Application Priority Data
Apr. 7, 2017  (JP) .............................. JP2017-077004

(51) Int. Cl.
*G01R 31/392* (2019.01)
*G01R 31/374* (2019.01)
(Continued)

(52) U.S. Cl.
CPC ........... *G01R 31/392* (2019.01); *G01R 31/36* (2013.01); *G01R 31/367* (2019.01);
(Continued)

(58) Field of Classification Search
CPC .... G01R 31/392; G01R 31/36; G01R 31/389; G01R 31/367; H01M 10/48; H01M 10/482
See application file for complete search history.

(56) References Cited

U.S. PATENT DOCUMENTS

2002/0024319 A1*  2/2002  Haraguchi ............ H02J 7/0016
                                                                    320/122
2009/0096459 A1   4/2009  Yoneda et al.
(Continued)

FOREIGN PATENT DOCUMENTS

JP    2009-097878 A    5/2009
JP    2013-029411 A    2/2013
(Continued)

OTHER PUBLICATIONS

International Search Report dated Jul. 3, 2018 issued in PCT/JP2018/014340.

*Primary Examiner* — Manuel L Barbee
(74) *Attorney, Agent, or Firm* — Scully, Scott, Murphy & Presser, P.C.

(57) ABSTRACT

A battery module 1 includes a group battery 2 in which batteries 30 (31 to 33) are connected in series, and an assessment evaluation unit 3 configured to calculate respective states of health of battery cells 10, in which the group battery 2 includes label elements 20 respectively connected in parallel with the battery cells 10 and configured such that respective impedance characteristics of the batteries 30 differ from one another, and the assessment evaluation unit 3 includes a measurement unit 42 configured to measure a first Cole-Cole plot of the group battery 2, a first calculation unit 44 configured to decompose the first Cole-Cole plot into respective second Cole-Cole plots of the batteries 30, a second calculation unit 44 configured to calculate respective third Cole-Cole plots of the battery cells 10 from the second
(Continued)

Cole-Cole plots, and a third calculation unit 45 configured to calculate respective states of the battery cells 10 from the third Cole-Cole plots.

9 Claims, 21 Drawing Sheets

(51) Int. Cl.
    *G01R 31/36* (2020.01)
    *G01R 31/389* (2019.01)
    *G01R 31/367* (2019.01)
    *H02J 7/00* (2006.01)
    *H01M 10/48* (2006.01)

(52) U.S. Cl.
    CPC ......... *G01R 31/374* (2019.01); *G01R 31/389* (2019.01); *H01M 10/48* (2013.01); *H01M 10/482* (2013.01); *H02J 7/00* (2013.01)

(56) References Cited

U.S. PATENT DOCUMENTS

| | | | |
|---|---|---|---|
| 2012/0306507 A1* | 12/2012 | Fujimatsu | G01R 31/3835 324/434 |
| 2014/0159664 A1* | 6/2014 | Yoshida | H01M 10/448 320/116 |
| 2014/0184159 A1* | 7/2014 | Kachi | H01M 16/00 320/109 |
| 2014/0287287 A1 | 9/2014 | Osaka et al. | |
| 2018/0337536 A1* | 11/2018 | Li | H01M 10/443 |

FOREIGN PATENT DOCUMENTS

| | | |
|---|---|---|
| JP | 2014-074686 A | 4/2014 |
| JP | 2014-102111 A | 6/2014 |
| JP | 2014-134467 A | 7/2014 |
| JP | 2017-044568 A | 3/2017 |
| WO | 2013/054813 A1 | 4/2013 |

* cited by examiner

GROUP BATTERY, BATTERY MODULE, AND METHOD FOR EVALUATING BATTERY MODULE

TECHNICAL FIELD

An embodiment of the present invention relates to a group battery in which a plurality of battery cells are connected in series, a battery module including the group battery in which the plurality of battery cells are connected in series, and a method for evaluating the battery module including the group battery in which the plurality of battery cells are connected in series.

BACKGROUND ART

A battery module including a secondary battery capable of charging and discharging is used for a portable apparatus, an electric power tool, and an electric vehicle, for example.

In the battery module, a plurality of batteries are connected in series to constitute a group battery, to obtain a desired output voltage. Further, group batteries each configured such that a predetermined output voltage is obtained are connected in parallel, to obtain a desired current capacity. As the group batteries, battery sets each obtained by connecting a plurality of batteries in parallel such that a desired current capacity is obtained may be connected in series to obtain a desired output voltage.

As a method for evaluating a characteristic of a battery cell in a secondary battery such as a lithium ion battery, an alternating-current impedance measurement method has been known. For example, Japanese Patent Application Laid-Open Publication No. 2014-74686 discloses an evaluation method for analyzing a Cole-Cole plot of a battery cell acquired by an alternating-current impedance method using an equivalent circuit model.

Although a plurality of battery cells constituting a group battery deteriorates due to lapse of time and repetition of charging and discharging, respective states of health (SOH) of the battery cells are not the same.

Japanese Patent Application Laid-Open Publication No. 2013-29411 discloses a measurement apparatus in which battery cells in a group battery are respectively connected to impedance calculation units to evaluate states of health of the battery cells.

However, the measurement apparatus including the plurality of impedance calculation units respectively corresponding to a plurality of batteries has been complicated and expensive. A method for measuring a plurality of impedances to correspond to the plurality of batteries has been time-consuming and complicated.

CITATION LIST

Patent Literature

Patent Literature 1: Japanese Patent Application Laid-Open Publication No. 2014-74686
Patent Literature 2: Japanese Patent Application Laid-Open Publication No. 2013-29411

DISCLOSURE OF INVENTION

Technical Problem

An embodiment of the present invention is directed to providing a group battery capable of evaluating respective states of a plurality of battery cells, a battery module having a simple configuration in which the respective states of the plurality of battery cells constituting the group battery can be evaluated, and a method for evaluating a battery module having a simple configuration in which the respective states of the plurality of battery cells constituting the group battery can be evaluated.

Means for Solving the Problem

A group battery according to an aspect of the present invention is a group battery in which N (N≥2) batteries each including a battery cell are connected in series, in which at least (N−1) of the batteries respectively include label elements each connected in parallel with the battery cell and configured such that respective impedance characteristics of the N batteries differ from one another.

A battery module according to another aspect is a battery module including a group battery in which N (N≥2) batteries each including a battery cell are connected in series, and an assessment evaluation unit configured to calculate respective states of the N battery cells, in which at least (N−1) of the batteries respectively include label elements each connected in parallel with the battery cell and configured such that respective impedance characteristics of the N batteries differ from one another, and the assessment evaluation unit includes a measurement unit configured to measure a first Cole-Cole plot as an impedance characteristic of the group battery, a first calculation unit configured to decompose the first Cole-Cole plot into respective second Cole-Cole plots of the N batteries, a second calculation unit configured to eliminate respective influences of impedance characteristics of the label elements from the second Cole-Cole plots to calculate respective third Cole-Cole plots of the battery cells, and a third calculation unit configured to calculate respective states of the battery cells based on the third Cole-Cole plots.

A method for evaluating a battery module according to still another aspect includes a measurement step for acquiring a first Cole-Cole plot of a group battery in which N (N≥2) batteries each including a battery cell are connected in series and label elements configured such that respective impedance characteristics of the N batteries differ from one another are connected in parallel with at least (N−1) of the batteries, a first calculation step for decomposing the first Cole-Cole plot into respective second Cole-Cole plots of the N batteries, a second calculation step for eliminating respective influences of impedance characteristics of the label elements from the second Cole-Cole plots to calculate respective third Cole-Cole plots of the N battery cells, and a state calculation step for calculating respective states of the N battery cells based on the third Cole-Cole plots.

Advantageous Effect of Invention

An embodiment of the present invention can provide a group battery capable of evaluating respective states of a plurality of battery cells, a battery module having a simple configuration in which the respective states of the plurality of battery cells constituting the group battery can be evaluated, and a method for evaluating the battery module having the simple configuration in which the respective states of the plurality of battery cells constituting the group battery can be evaluated.

BEST MODE FOR CARRYING OUT THE INVENTION

First Embodiment

<Configuration of Battery Module>

Figure 1:
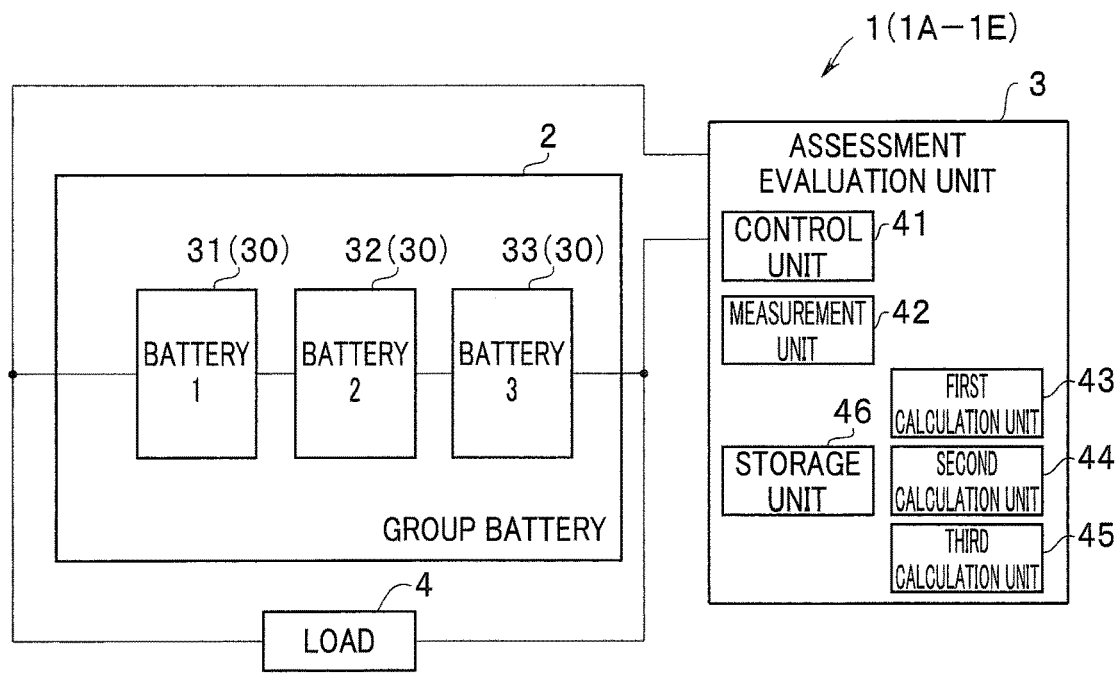
FIG. 1 is a configuration diagram of a battery module according to a first embodiment.

As illustrated in FIG. 1, a battery module 1 according to a first embodiment includes a group battery 2 and an assessment evaluation unit 3. The battery module 1 is connected to a load 4, e.g., a driving circuit for an electric vehicle, to output drive power. The battery module 1 is connected to a charging circuit (not illustrated), to receive charging power.

The group battery 2 according to the embodiment is configured by connecting three batteries 31, 32, and 33 in series. Each of the plurality of batteries 31 to 33 is hereinafter referred to as a battery 30, for example.

The assessment evaluation unit 3 includes a control unit 41, a measurement unit 42, a first calculation unit 43, a second calculation unit 44, a third calculation unit 45, and a storage unit 46. The control unit 41 performs entire control of the assessment evaluation unit 3. The measurement unit 42 measures a first Cole-Cole plot of the group battery 2. The first calculation unit 43 decomposes the first Cole-Cole plot into respective second Cole-Cole plots of the plurality of batteries 30. The second calculation unit 44 calculates respective third Cole-Cole plots of a plurality of battery cells 10 from the second Cole-Cole plots. The third calculation unit 45 calculates respective states of health of the battery cells 10 based on the third Cole-Cole plots. The storage unit 46 stores a control program for the control unit 41 and information used for calculation by the first calculation unit 43, the second calculation unit 44, and the third calculation unit 45, for example.

Note that, although the control unit 41, the measurement unit 42, the first calculation unit 43, the second calculation unit 44, and the third calculation unit 45 are each composed of a CPU (central processing unit), for example, the whole may be composed of one CPU. The storage unit 46 composed of a semiconductor memory or the like may be integral with a CPU. Further, when the battery module 1 is used as a part of another system, a component of the assessment evaluation unit 3 may also serve as a component of the other system.

Figure 2:
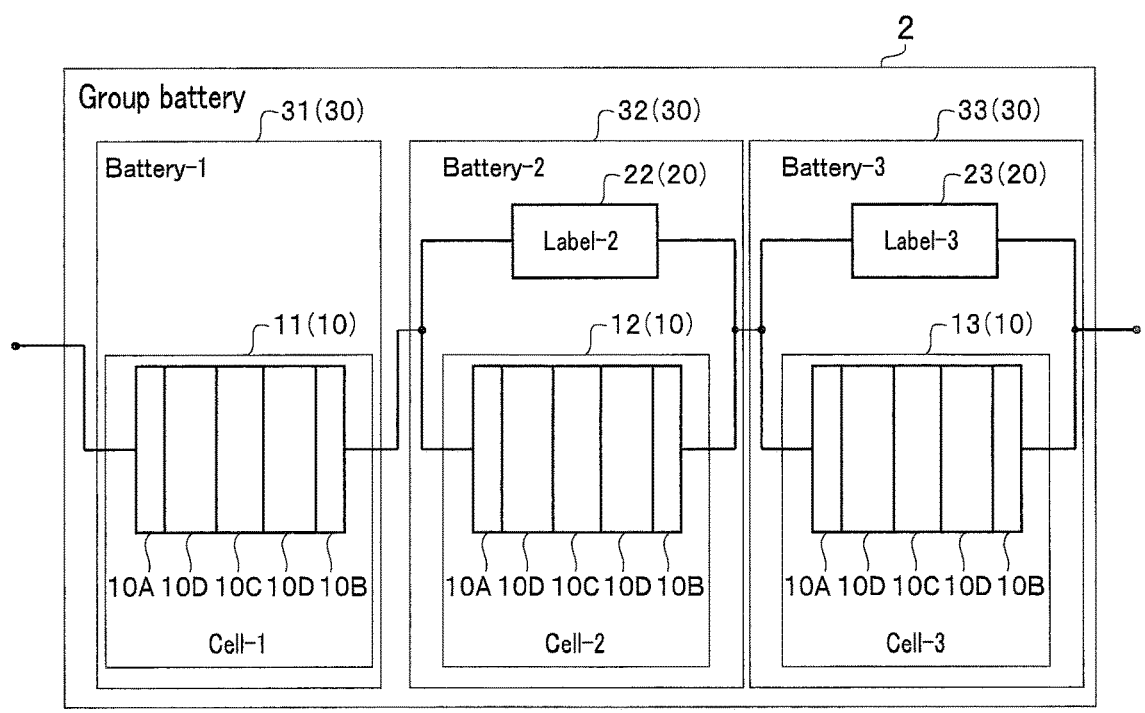
FIG. 2 is a configuration diagram of a group battery in the battery module according to the first embodiment.

As illustrated in FIG. 2, the batteries 30 (31 to 33) of the group battery 2 respectively include battery cells 10 (11 to 13) and label elements 20 (22 and 23) connected in parallel with the battery cells 12 and 13. Each of the battery cells 10 is a lithium ion battery cell, for example, and includes an anode 10A configured to occlude/emit lithium ions, an electrolyte 10B, a separator 10C, and a cathode 10D configured to occlude/emit lithium ions. The anode 10A contains a lithium-cobalt oxide, for example, the cathode 10D contains a carbon material, for example, and the separator 10C is composed of polyolefin, for example. The electrolyte 10B is an electrolyte obtained by dissolving a lithium salt such as LiPF6 (lithium hexafluorophosphate) in carbonate. Note that the battery cell may have a structure in which the separator 10C composed of a porous material or the like is filled with the electrolyte 10B.

Each of the battery cells 10 illustrated in FIG. 2 is a schematic diagram, and may have various types of known structures, e.g., a wound-type cell, a coin-type cell, or a laminate cell. Further, respective materials for the anode 10A, the cathode 10D, the separator 10C, and the like are not limited to the above-described materials, but can include various types of known materials.

The label elements 22 and 23 are respectively connected in parallel with the battery cells 12 and 13 in the batteries 32 and 33 among the three batteries 31 to 33 constituting the group battery 2, as already described. The label element 20 is an RC element including a resistance component R and a capacitance component C. Even if the battery cells 10 (11, 12, and 13) are the same, respective frequency characteristics of impedances of the batteries 30 (31, 32, and 33) differ from one another because the label elements 20 (22 and 23) are connected. Conversely, the label elements 20 are configured such that respective impedance characteristics of the batteries 30 differ from one another.

The label element 20 needs to be configured to interrupt a direct current and pass an alternating current. Therefore, the label element 20 includes a capacitor.

In the battery module 1, the respective impedance characteristics of the batteries 31, 32, and 33 differ from one another. Accordingly, if an impedance characteristic of the group battery 2, i.e., a composite impedance characteristic (a first Cole-Cole plot) of the three batteries is measured, the composite impedance characteristic can be decomposed into respective impedance characteristics (second Cole-Cole plots) of the batteries 31, 32, and 33.

<Impedance Measurement>

A frequency characteristic of an impedance of a battery is measured by an alternating-current impedance method, for example.

In the alternating-current impedance method, a signal obtained by superimposing a minute alternating-current voltage signal on a direct-current voltage is applied to each of the battery cells 10, to measure the impedance from a response signal. In the alternating-current impedance measurement method, a signal voltage to be applied is small. Accordingly, an impedance characteristic can be measured without changing a state of the battery cell 10 to be measured.

A direct-current voltage component is set to approximately a voltage of the battery cell 10 to be measured. An alternating-current voltage component to be superimposed is set to a voltage low enough not to affect a characteristic of the battery cell 10. Note that as the alternating-current voltage component to be superimposed, an alternating current set to the voltage low enough not to affect the characteristic of the battery cell 10 may be used.

In the alternating-current impedance measurement method, a signal frequency is swept from a high frequency to a low frequency, to measure the impedance of the battery at each of the frequencies at predetermined frequency intervals.

For example, an alternating-current impedance measurement is performed under the following conditions. Note that a bias voltage is a voltage of the group battery 2. That is, the battery module 1 can perform the alternating-current impedance measurement even when the group battery 2 is used.

Frequency measurement range: 0.1 Hz to 100 kHz
Voltage amplitude: 5 mV
Bias voltage: 12 V
Temperature: 25° C.

Figure 3:
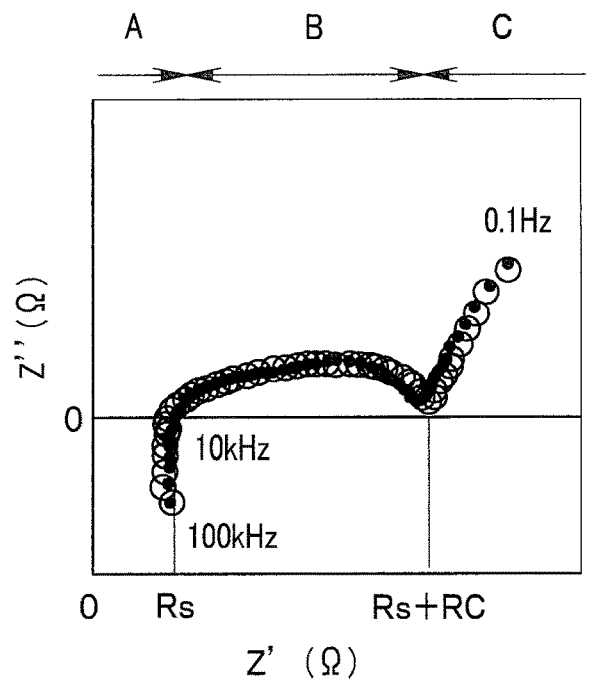
FIG. 3 illustrates an example of an impedance characteristic of a battery cell.

FIG. 3 illustrates an example of a frequency characteristic of an impedance of a single battery cell. A frequency characteristic of a measured impedance is indicated by a Cole-Cole plot (or a Nyquist plot) displayed on a complex plane using a resistance component to enter a real number axis (Z') and using a reactance component (which is normally capacitive) to enter an imaginary number axis (Z"). As illustrated in FIG. 3, when the measurement frequency is changed from a high frequency to a low frequency, a Cole-Cole plot as an impedance locus including a semicircle is obtained clockwise.

Note that the Cole-Cole plot is divided into an inductance region (region A), a charge transfer reaction region (region B), and an ion diffusion region (region C), as illustrated in FIG. 3. The inductance region (region A) is a high-frequency region of 10 kHz or more, for example.

A frequency seeping method is not the only way to measure the Cole-Cole plot. For example, respective impedances at a plurality of frequencies (f1, 2/1, 3/1, ...) may be measured by performing Fourier transformation for a response signal including harmonic components (2/1, 3/1, .

. . ) using a rectangular wave having a basic frequency f1 as an input signal. Alternatively, an input signal obtained by superimposing respective signals having a plurality of frequencies may be used.

To theoretically analyze a characteristic of a battery cell from a Cole-Cole plot, fitting processing based on an equivalent circuit model is performed. FIG. 3 illustrates a solution resistor Rs and a reaction resistor (charge transfer resistor) RC based on a simple equivalent circuit model. Note that it is known that an influence of deterioration of each of the battery cells 10 is significant particularly in the charge transfer reaction region (region B).

Figure 4:
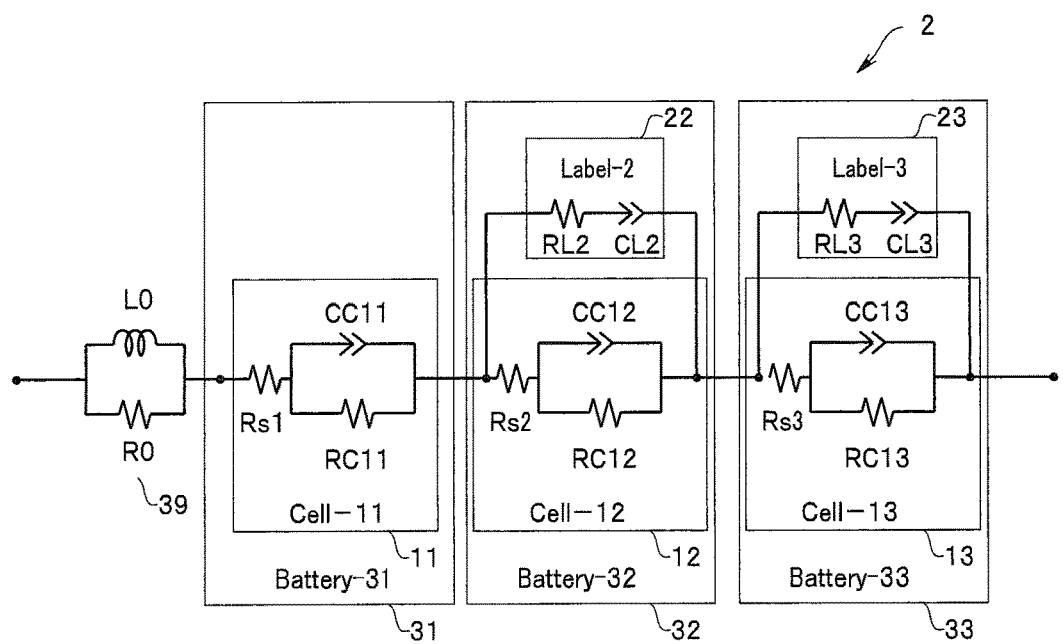
FIG. 4 is an equivalent circuit diagram of the group battery in the battery module according to the first embodiment.

FIG. 4 illustrates an equivalent circuit model of the group battery 2 including the plurality of batteries 31 to 33. The model includes a circuit corresponding to a measurement system 39 and circuits respectively corresponding to the batteries 30 (31 to 33). The circuit corresponding to the measurement system 39 includes an inductance L0 and a resistor R0. Circuits corresponding to the battery cells 10 (11 to 13) respectively include solution resistors Rs (Rs1, Rs2, and Rs3), charge transfer resistors RC (RC11, RC12, and RC13), and interfacial capacitors CC (CC11, CC12, and CC13). Circuits corresponding to the label elements 20 (22 and 23) respectively include resistors RL (RL2 and RL3) and capacitances CL (CL2 and CL3).

Note that in the equivalent circuit model, a diffusion resistor Zw is omitted. Although a more complicated equivalent circuit model may be used, as disclosed in Japanese Patent Application Laid-Open Publication No. 2013-29411, to obtain a more accurate value, as described below, a calculation time period becomes long. Therefore, an appropriate equivalent circuit model is selected depending on an accuracy of a result to be required.

In the present embodiment, an RC element obtained by connecting the resistor RL2 having a resistance of 5 mΩ and the capacitor CL2 having a capacitance of 330 µF in series as the label element 22 is connected in parallel with the second battery cell 12. An RC element obtained by connecting the resistor RL3 having a resistance of 10 mΩ and the capacitor CL3 having a capacitance of 330 µF in series as the label element 23 is connected in parallel with the third battery cell 13. Note that no label element is connected to the first battery cell 11 in the first battery 31.

That is, in the group battery 2 in which the N batteries 30 are connected in series, the label elements 20 respectively configured in the at least (N−1) batteries 30 such that respective impedance characteristics differ from one another may be connected in parallel with the battery cells 10. Needless to say, all the batteries 30 may respectively have label elements 20. The same label elements 20, which can vary in capacitance or resistance, may be respectively connected to the plurality of batteries 30, and the respective capacitances or resistances of the label elements may be adjusted to respectively have different values.

The measurement unit 42 in the assessment evaluation unit 3 measures a first Cole-Cole plot as a frequency characteristic of an impedance of the group battery 2. The first Cole-Cole plot is a composite impedance characteristic obtained by superimposing respective second Cole-Cole plots as the impedance characteristics of the plurality of batteries 31 to 33.

The first calculation unit 43 decomposes the first Cole-Cole plot into respective second Cole-Cole plots of the plurality of batteries 31 to 33. That is, the second Cole-Cole plots of the plurality of batteries 31 to 33 greatly differ from one another due to the label elements 22 and 23. Therefore, the first calculation unit 43 can decompose the composite impedance characteristic (first Cole-Cole plot) into the respective impedance characteristics (second Cole-Cole plots) of the batteries 31, 32, and 33 using a curve fitting method, for example.

For example, the storage unit 46 stores respective impedance characteristics or states of health which have been acquired in previous measurement of the batteries 30 (31 to 33) previously acquired. Note that the storage unit 46 stores the second Cole-Cole plot of the battery 30 having a state of health (SOH) of 100% which has not deteriorated in first measurement. That is, the state of health (SOH) indicates that the smaller its value is, the more greatly deterioration progresses.

The first calculation unit 43 performs repetitive calculation such that the composite impedance characteristic (the Cole-Cole plot obtained by synthesis) is within a predetermined error range from the first Cole-Cole plot measured by the measurement unit 42 while changing respective parameters of components in the equivalent circuit model based on the states of health, for example, in the previous measurement of the battery cells 10.

The second calculation unit 44 eliminates respective influences of impedance characteristics of the label elements 22 and 23 from the second Cole-Cole plots to calculate respective third Cole-Cole plots of the battery cells 12 and 13. For example, the storage unit 46 stores the respective impedance characteristics of the label elements 22 and 23.

In the first battery 31 in which no label element is disposed, the second Cole-Cole plot and the third Cole-Cole plot are the same.

The third calculation unit 45 calculates respective states of health (SOH) of the battery cells 10 based on the third Cole-Cole plots. That is, a relationship between the states of health of the battery cells 10 and the third Cole-Cole plots is previously acquired, and is stored in the storage unit 46.

As described above, the battery module 1 can evaluate the respective states of health SOH of the plurality of battery cells 10 constituting the group battery 2 only by measuring the composite impedance characteristic (the first Cole-Cole plot) of the group battery 2.

<Method for Evaluating Battery Module>

Figure 5:
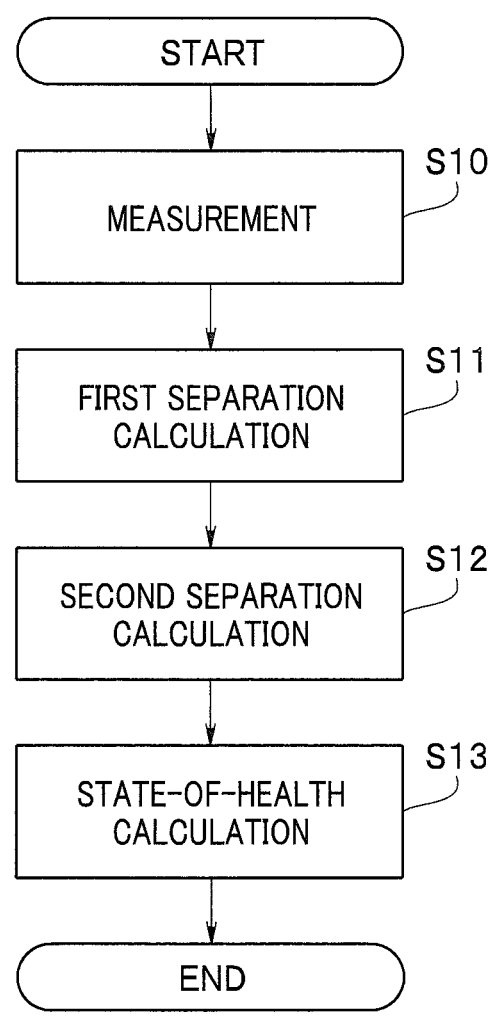
FIG. 5 is a flowchart for describing a method for evaluating the battery module according to the first embodiment.

A method for evaluating a battery module will be specifically described below with reference to a flowchart of FIG. 5.

<Step S10> Measurement Step

The measurement unit 42 in the battery module 1 applies a sine wave measurement signal having a predetermined frequency, e.g., 100 kHz to 0.1 Hz to the group battery 2, and acquires frequency characteristic data (a first Cole-Cole plot) of an impedance. Note that an impedance characteristic is greatly affected by a temperature. Accordingly, the measurement unit 42 also acquires a measurement temperature by a temperature sensor (not illustrated) disposed in the group battery 2 when acquiring the Cole-Cole plot. The measurement unit 42 preferably has a function of correcting a temperature of the acquired first Cole-Cole plot.

Figure 6:
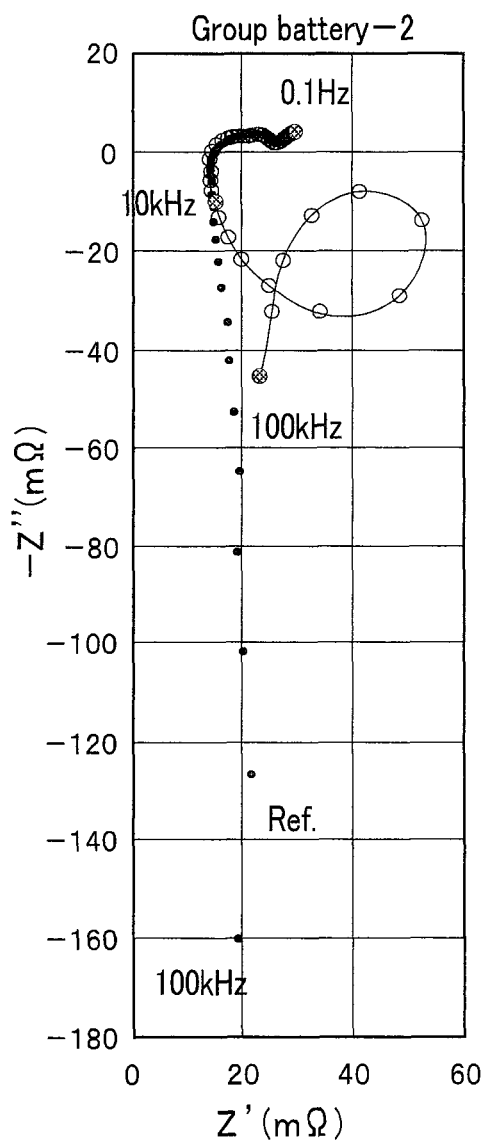
FIG. 6 illustrates a first Cole-Cole plot of the group battery in the battery module according to the first embodiment.

FIG. 6 illustrates the first Cole-Cole plot of the group battery 2 which has been measured by the measurement unit 42. For reference, a Cole-Cole plot of a group battery (Ref.) in a comparative example to which the label element 20 is not connected is indicated by black circles. The first Cole-Cole plot greatly changes to have a loop portion and such that the loop portion crosses itself particularly in an inductance region (region A) having a high frequency of 10 kHz or more when the label element 20 is connected to the group battery. The Cole-Cole plot having such a shape has a shape not normally found in measurement of batteries and a group battery, and the shape is a characteristic of a Cole-Cole plot of the group battery 2 to which the label element 20 is added.

Note that, even if the label element 20 is connected to the group battery 2, a charge transfer reaction region (region B) having a frequency of less than 10 kHz where a change corresponding to the state of health of the battery cell 10 having the first Cole-Cole plot significantly appears does not greatly change, unlike the inductance region (region A) having a frequency of 10 kHz or more.

<Step S11> First Separation Calculation (First Calculation Step)

Figure 7A:
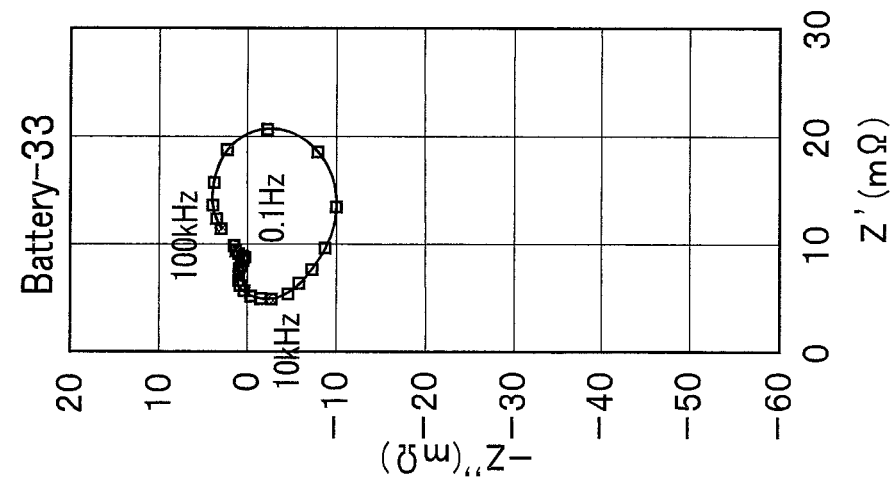
FIG. 7A illustrates a second Cole-Cole plot of a first battery in the battery module according to the first embodiment.
Figure 7B:
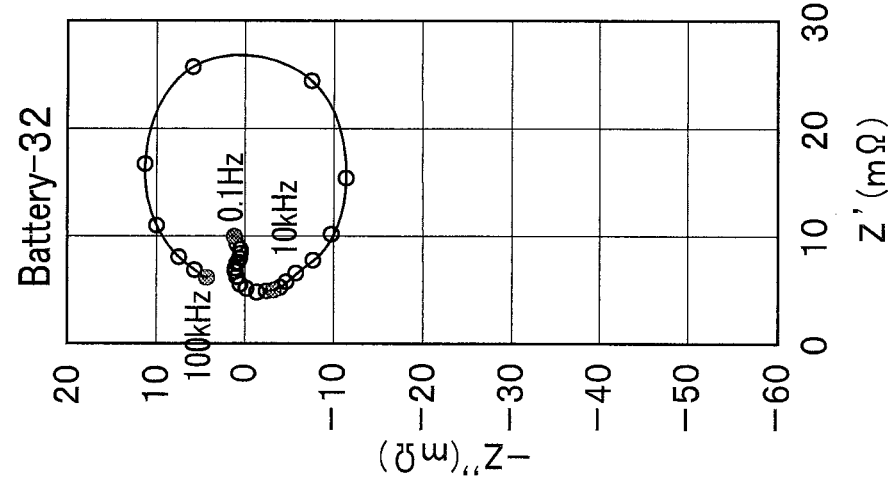
FIG. 7B illustrates a second Cole-Cole plot of a second battery in the battery module according to the first embodiment.
Figure 7C:
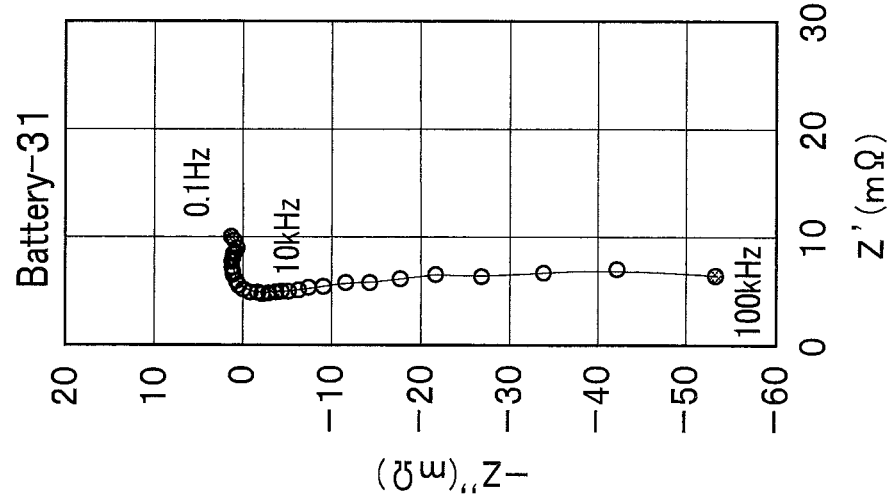
FIG. 7C illustrates a second Cole-Cole plot of a third battery in the battery module according to the first embodiment.

The first calculation unit 43 decomposes the first Cole-Cole plot (FIG. 6) into respective second Cole-Cole plots of the three batteries 31 to 33 illustrated in FIGS. 7A, 7B, and 7C.

For example, the first calculation unit 43 decomposes the first Cole-Cole plot into three second Cole-Cole plots while changing parameters in an equivalent circuit model based on second Cole-Cole plots obtained by previous measurement of the batteries 31 to 33 which have been previously acquired and stored in the storage unit 46.

The respective second Cole-Cole plots of the batteries 31 to 33 greatly differ from one another due to connection of the label elements 22 and 23, as illustrated in FIGS. 7A, 7B, and 7C. That is, the first battery 31 and the batteries 32 and 33 greatly differ from one another in the second Cole-Cole plots particularly in the inductance region having a frequency of 10 kHz or more. The second battery 32 and the third battery 33 greatly differ from one another in the second Cole-Cole plots particularly in the inductance region having a frequency of 10 kHz or more. Therefore, the first calculation unit 43 can decompose the first Cole-Cole plot into three second Cole-Cole plots.

In a curve fitting method, it is preferable that respective states of health of the battery cells 11 to 13 or respective second Cole-Cole plots of the batteries 31 to 33 in previous measurement are synthesized to create a first Cole-Cole plot (initial value). When parameters (numerical values of components) in the equivalent circuit model of the battery cells 11 to 13 are changed such that a first Cole-Cole plot (measurement value) and the first Cole-Cole plot are within a predetermined error range, the first Cole-Cole plot can be decomposed into three second Cole-Cole plots in a short time.

Deterioration of each of the battery cells 11 to 13 has a predetermined pattern. For example, the solution resistor Rs and the charge transfer resistor RC gradually increase. Therefore, a Cole-Cole plot obtained when the solution resistor Rs and the charge transfer resistor RC based on the equivalent circuit model calculated from the second Cole-Cole plots in the previous measurement increase in resistance is simulated, and a difference from the measured Cole-Cole plot is calculated. If the difference is larger than a predetermined value, the respective numerical values of the parameters are changed, to calculate the difference again. If the difference (error) falls within a predetermined range by repetition of the calculation, curve fitting processing is completed.

Further, it is preferable that a use state (e.g., an elapsed time period, a number of times of charging and discharging, and a temperature condition) of the group battery 2 from the previous measurement is stored in the storage unit 46 to determine respective rates of change of the parameters in the equivalent circuit model.

Note that a measurement point indicated in the Cole-Cole plot includes not only a resistance component (Z') and a reactance component (Z") but also information about a measurement frequency (f). Therefore, in the curve fitting method, a regression analysis by a least square method is performed, for example, such that a distance between a three-dimensional first curve (a measurement value) and a three-dimensional second curve (a calculation value) becomes minimal.

The larger differences among the respective three second Cole-Cole plots of the batteries 31 to 33 are, the higher a calculation accuracy of the first calculation unit 43 becomes, and the easier calculation becomes.

Therefore, if the label element 20 is composed of only a capacitance component, it is preferable that the label element 20 includes a capacitance component having a capacitance which is 50% or more of a capacitance of the battery cell 10 and respective capacitances of the plurality of batteries 30 differ from one another by 50% or more.

For example, in the battery module 1 according to the present embodiment, a capacity in a direct current, i.e., a capacitance CC (F) of the battery cell 10 is 130 μF. Therefore, if the label element 20 has a capacitance of 65 μF or more, and the label element 22 has a capacitance of 65 μF, the label element 23 preferably has a capacitance of 97.5 ΩF or more.

Note that the label element 20 more preferably includes a capacitance component having a capacitance which is 100% or more of the capacitance of the battery cell 10.

If the label element 20 includes a capacitance component (capacitor) and a resistance component (resistor), like in the group battery 2 according to the present embodiment, a ratio of a current flowing through the label element 20 to a current flowing through the battery cell 10 changes depending on the resistance component even if the label element 20 and the battery cell 10 have the same capacitance.

Therefore, it is preferable that the label element 20 includes a capacitance component having a capacitance which is 50% or more and more preferably 100% or more of the capacitance of the battery cell 10 and a resistance component having a direct-current resistance which is 10% or more of a direct-current resistance of the battery cell 10 and respective direct-current resistances of the plurality of label elements 20 differ from one another by 25% or more.

For example, in the battery module 1 according to the present embodiment, the direct-current resistance of the battery cell 10 is 10 mΩ. Therefore, it is preferable that the label element 20 includes a resistance component having a direct-current resistance of 1 mΩ or more in addition to a capacitance component (capacitor) having a capacitance of 65 μF or more, and the label element 23 has a direct-current resistance of 1.25 mΩ or more if the label element 22 has a direct-current resistance of 1 mΩ.

Note that it is more preferable that the label element 20 includes a resistance component having a direct-current resistance which is 25% or more of the direct-current resistance of the battery cell 10 and respective direct-current resistances of the plurality of label elements 20 differ from one another by 25% or more.

Needless to say, the plurality of label elements 20 differ from one another in capacitance and direct-current resistance. Further, the plurality of label elements respectively including capacitor elements which are the same in capacitance and resistor elements which are different in direct-current resistance and a plurality of label elements respectively including capacitor elements which differ in capacitance may be combined with each other and used.

The capacitance and the direct-current resistance, for example, of the battery cell 10 change depending on deterioration. As the capacitance and the direct-current resistance, for example, of the battery cell 10 used to set the label element 20, a value of the battery cell 10 having a state of health (SOH) of 100% is used.

The label element 20 is not limited to an RC element as long as the label element 20 interrupts a direct current and passes an alternating current. For example, the label element 20 may be composed of only a capacitance component, e.g., only a chip capacitor. However, if the label element 20 is composed of only a capacitance component, more current flows through the label element 20 than a current flowing through the RC element. Accordingly, although the second Cole-Cole plots become easy to separate, the accuracy of the third Cole-Cole plot of the battery cell 10 decreases.

Even if the label element is composed of only a capacitance component or only an inductance component, a conductor resistor exists. Therefore, although the label element 20 includes a small amount of resistance component, the resistance component inevitably included may not be required to be considered when the label element is set.

The label element 20 is configured to be changeable such that respective impedance characteristics of the plurality of batteries 30 can be separated from the composite impedance characteristic of the group battery 2, and can include various types of passive elements (a C element, an RC element, an LC element, and an LCR element) as long as the label element 20 interrupts a direct current and passes an alternating current. Note that an active element or a filter circuit may be used as the label element 20 if it has the above-described function.

<Step S12> Second Separation Calculation (Second Calculation Step)

The second calculation unit 44 separates the third Cole-Cole plots of the battery cells 10, respectively, from the second Cole-Cole plots of the batteries 30.

Figure 8A:
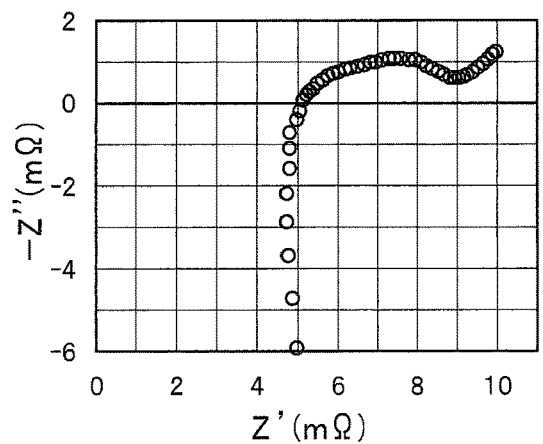
FIG. 8A illustrates a third Cole-Cole plot of a first battery cell in the battery module according to the first embodiment.

Note that a second Cole-Cole plot (FIG. 7A) of the first battery 31 not including the label element 20 is the same as a third Cole-Cole plot of the first battery cell 11 illustrated in FIG. 8A.

Figure 8B:
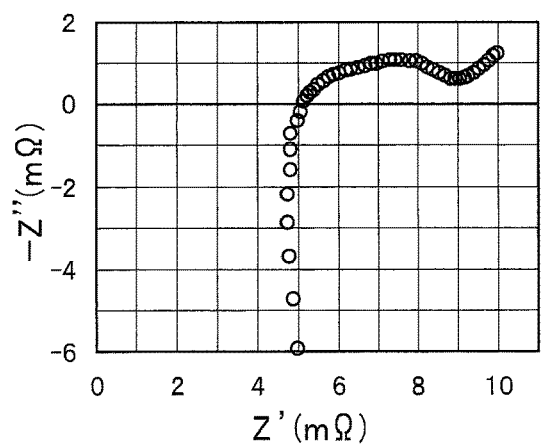
FIG. 8B illustrates a third Cole-Cole plot of a second battery cell in the battery module according to the first embodiment.

On the other hand, calculation for eliminating an influence of an impedance characteristic of the label element 22 from the second Cole-Cole plot (FIG. 7B) of the second battery 32 is performed to obtain a third Cole-Cole plot of the second battery cell 12 illustrated in FIG. 8B. Similarly, calculation for eliminating an influence of an impedance characteristic of the label element 23 from the second Cole-Cole plot (FIG. 7C) of the third battery 33 is performed to obtain a third Cole-Cole plot of the third battery cell 13 illustrated in FIG. 8C.

Respective frequency characteristics (Cole-Cole plots) of the impedances of the label elements 22 and 23 are previously acquired, and are stored in the storage unit 46. Note that a part of data used to calculate a state of health of a Cole-Cole plot is illustrated in FIG. 8A, for example.

<Step S13> State-of-Health Calculation (State Calculation Step)

The third calculation unit 45 calculates the respective states of health of the battery cells 11, 12, and 13 based on respective third Cole-Cole plots of the battery cells.

Figure 9:
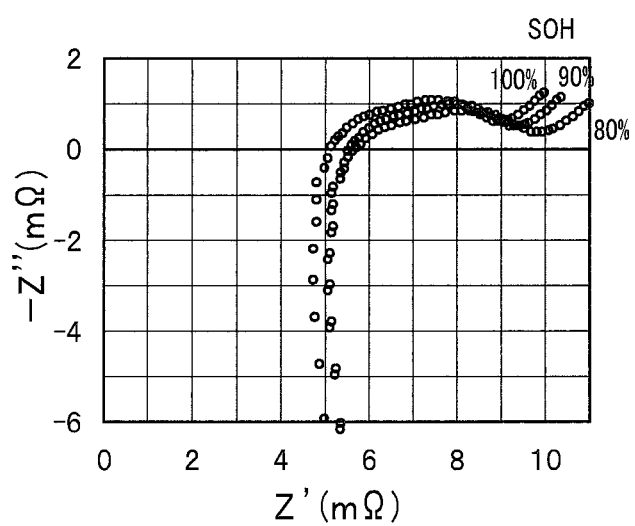
FIG. 9 illustrates respective Cole-Cole plots of battery cells, which differ from one another in state of health, in the battery module according to the first embodiment.

For example, respective impedance characteristics corresponding to the plurality of states of health (SOH) of the battery cells 10 are previously stored in the storage unit 46, as illustrated in FIG. 9. The third calculation unit 45 calculates the state of health from the third Cole-Cole plot and the impedance characteristic corresponding to the state of health (SOH).

Note that the impedance characteristic corresponding to the state of health (SOH) stored in the storage unit 46 is not limited to a Cole-Cole plot as a frequency characteristic of an impedance. For example, the state of health (SOH) of the battery cell 10 may be calculated based on the charge transfer resistor RC acquired from the Cole-Cole plot.

Figure 8C:
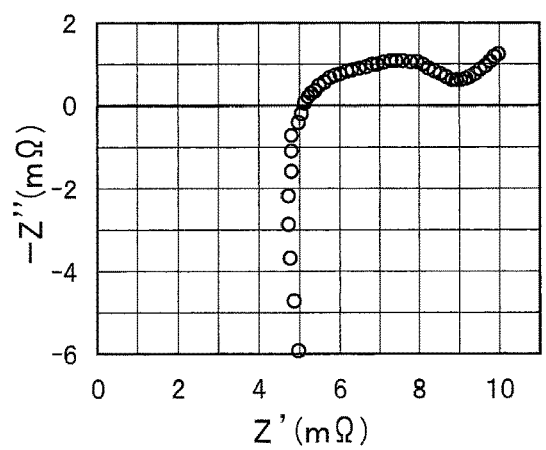
FIG. 8C illustrates a third Cole-Cole plot of a third battery cell in the battery module according to the first embodiment.

Note that in the present embodiment, the respective third Cole-Cole plots illustrated in FIGS. 8A, 8B, and 8C each match a Cole-Cole plot having a state of health (SOH) of 100% illustrated in FIG. 9. That is, all the respective states of health (SOH) of the battery cells 11, 12, and 13 are calculated to be 100% by the third calculation unit 45.

Note that the third calculation unit 45 can also calculate a state of charge (SOC) representing a charged capacity with respect to a maximum capacity of the battery cell 10 at the time of measurement based on an initial resistance value (nominal battery capacity) of the battery 30.

The state of charge of the battery cell 10 is also stored in the storage unit 46 by previously measuring a relationship between the Cole-Cole plot and the state of charge of the battery cell 10, like the state of health. The third calculation unit 45 calculates a state of charge from the third Cole-Cole plot and the impedance characteristic corresponding to the state of charge. Alternatively, the third calculation unit 45 may calculate a state of charge by extrapolation from a time period from a battery cell voltage at the time of measurement to a rated voltage (a voltage at the time of a battery capacity of 50%) of the battery cell at a current value which is one-fifth of a rate of a nominal battery cell capacity, for example.

That is, the battery module 1 (the third calculation unit 45) calculates a state of the battery cell 10, i.e., at least one of a state of health and a state of charge.

A battery module in which a plurality of group batteries 2 are connected in parallel preferably includes a circuit changeover switch for measuring respective first impedances of the group batteries 2. Note that in the case of a group battery in which battery sets each including a plurality of batteries connected in parallel are connected in series to obtain a desired output voltage, when the battery sets are regarded as one battery, respective states of battery cells included in the battery sets can be evaluated by the same configuration as the configuration in the present invention.

The battery module 1 includes the group battery 2 in which three batteries 31, 32, and 33 are connected in series. However, the number N of batteries 30 included in the group battery may be two or more.

As described above, the group battery according to the embodiment of the present invention is a group battery in which N (N≥2) batteries each including a battery cell are connected in series, and the at least (N−1) batteries respectively include label elements each connected in parallel with the battery cell and configured such that respective impedance characteristics of the N batteries differ from one another.

A battery module according to another embodiment is a battery module including a group battery in which N (N≥2) batteries each including a battery cell are connected in series and an assessment evaluation unit configured to calculate respective states of the N battery cells, in which the at least (N−1) batteries respectively include label elements each connected in parallel with the battery cell and configured such that respective impedance characteristics of the N batteries differ from one another, and the assessment evaluation unit includes a measurement unit configured to measure a first Cole-Cole plot as an impedance characteristic of the group battery, a first calculation unit configured to decompose the first Cole-Cole plot into respective second Cole-Cole plots of the N batteries, a second calculation unit configured to eliminate respective influences of impedance characteristics of the label elements from the second Cole-Cole plots to calculate respective third Cole-Cole plots of the battery cells, and a third calculation unit configured to calculate respective states of the battery cells based on the third Cole-Cole plots.

A method for evaluating a battery module according to still another embodiment includes a measurement step for acquiring a first Cole-Cole plot of a group battery in which N (N≥2) batteries each including a battery cell are connected in series and label elements configured such that respective impedance characteristics of the N batteries differ from one another are connected in parallel with at least (N−1) of the batteries, a first calculation step for decomposing the first Cole-Cole plot into respective second Cole-Cole plots of the N batteries, a second calculation step for eliminating respective influences of impedance characteristics of the label elements from the second Cole-Cole plots to calculate respective third Cole-Cole plots of the N battery cells, and a state calculation step for calculating respective states of the N battery cells based on the third Cole-Cole plots.

Other Embodiments

A group battery, a battery module, and a method for evaluating the battery module in each of the embodiments, described below, are similar to and have the same effect as the group battery 2, the battery module 1, and the method for evaluating the battery module according to the first embodiment, and hence components respectively having the same functions are assigned the same reference numerals and description of the components is omitted.

Second Embodiment

Figure 10:
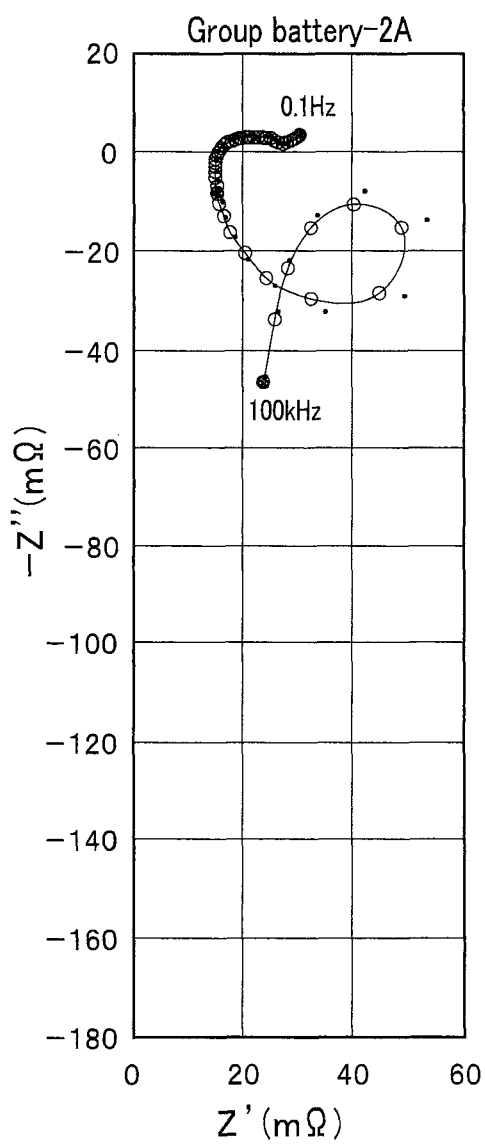
FIG. 10 illustrates a first Cole-Cole plot of a group battery in a battery module according to a second embodiment.

A first Cole-Cole plot (a frequency characteristic of an impedance) of a group battery 2A, which has been measured by a measurement unit 42 in a battery module 1A according to a second embodiment, is illustrated in FIG. 10. For reference, the first Cole-Cole plot of the group battery 2 in the battery module 1 (see FIG. 6) is indicated by black circles.

The first Cole-Cole plot of the group battery 2A is similar to but is slightly smaller in size of a loop portion than the first Cole-Cole plot of the group battery 2.

Figure 11A:
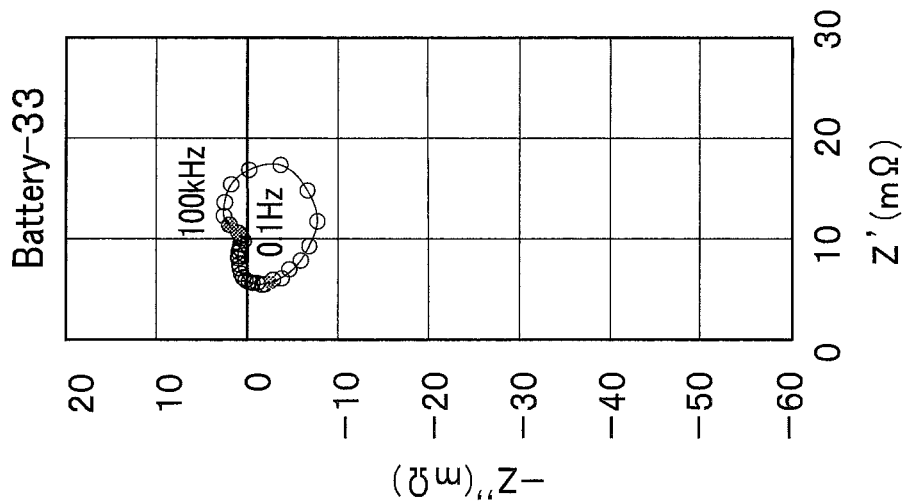
FIG. 11A illustrates a second Cole-Cole plot of a first battery in the battery module according to the second embodiment.
Figure 11B:
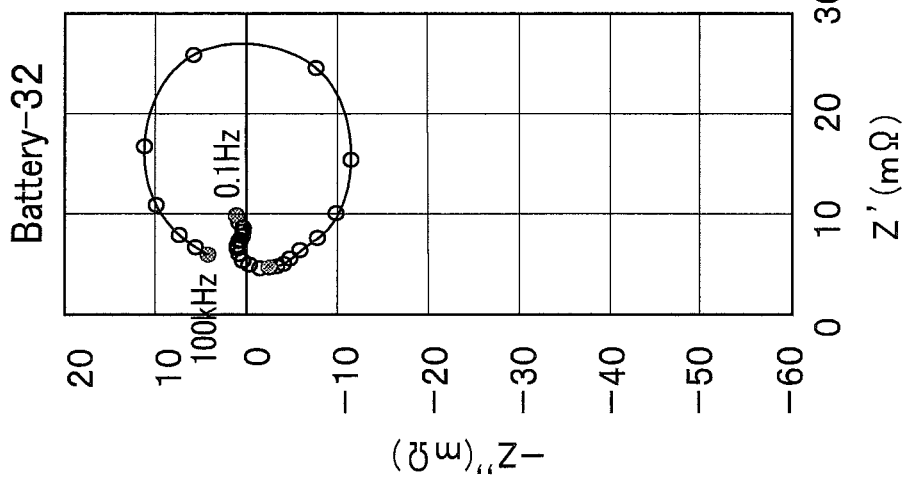
FIG. 11B illustrates a second Cole-Cole plot of a second battery in the battery module according to the second embodiment.
Figure 11C:
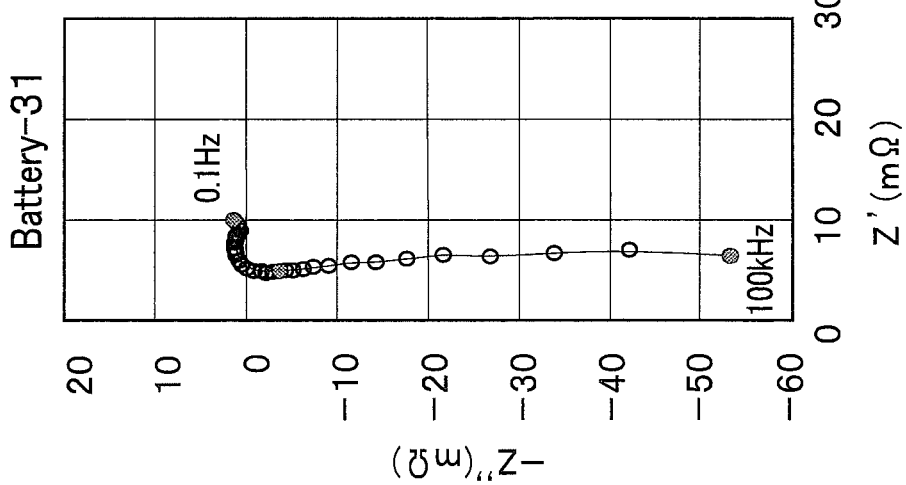
FIG. 11C illustrates a second Cole-Cole plot of a third battery in the battery module according to the second embodiment.

A first calculation unit 43 decomposes the first Cole-Cole plot into respective second Cole-Cole plots of batteries 31 to 33 illustrated in FIGS. 11A, 11B, and 11C.

The second Cole-Cole plots of the batteries 31 and 32 illustrated in FIGS. 11A and 11B are respectively the same as the second Cole-Cole plots of the batteries 31 and 32 in the group battery 2 (FIGS. 7A and 7B). However, the second Cole-Cole plot of the third battery 33 illustrated in FIG. 11C greatly differs particularly in an inductance region having a frequency of 10 kHz or more from the second Cole-Cole plot of the third battery 33 in the group battery 2 (FIG. 7C).

A second calculation unit 44 calculates respective third Cole-Cole plots of battery cells 10 from the second Cole-Cole plots.

Figure 12C:
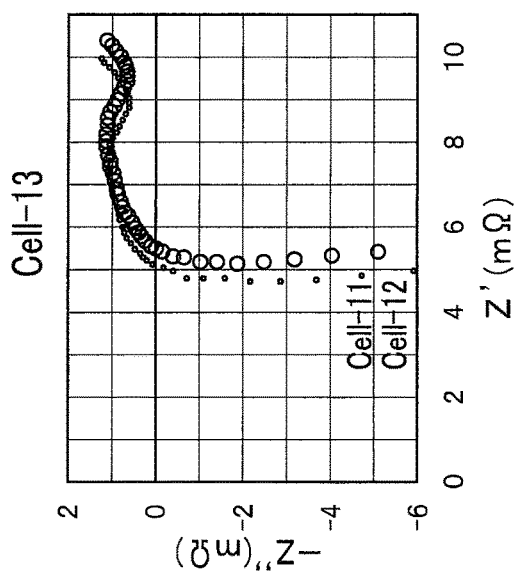
FIG. 12C illustrates a third Cole-Cole plot of a third battery cell in the battery module according to the second embodiment.
Figure 12B:
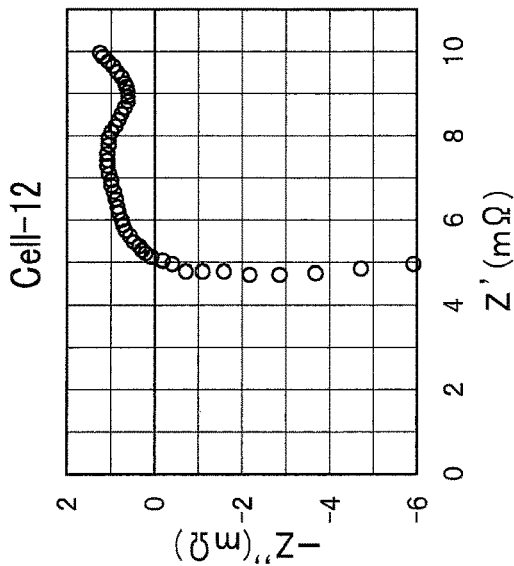
FIG. 12B illustrates a third Cole-Cole plot of a second battery cell in the battery module according to the second embodiment.
Figure 12A:
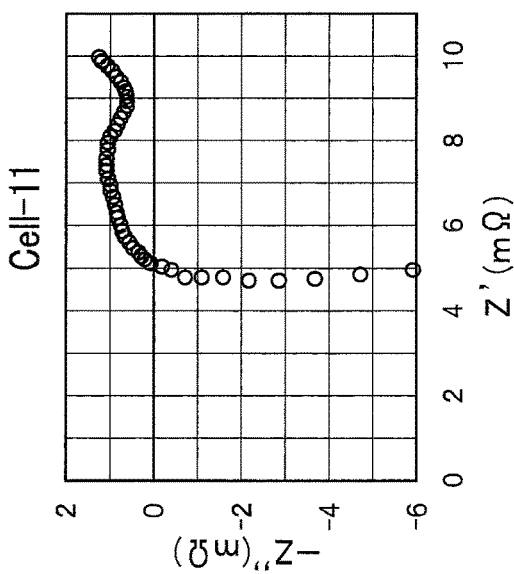
FIG. 12A illustrates a third Cole-Cole plot of a first battery cell in the battery module according to the second embodiment.

The respective third Cole-Cole plots of the battery cells 11 and 12 illustrated in FIGS. 12A and 12B are the same as the Cole-Cole plot (100%) illustrated in FIG. 9. Therefore, respective states of health (SOH) of the battery cells 11 and 12 in the battery module 1A are calculated to be 100%.

On the other hand, the third Cole-Cole plot of the third battery cell 13 illustrated in FIG. 12C differs from the Cole-Cole plot (an SOH of 100%) indicated by the black circle.

A method for calculating a state of health is performed by comparing the plurality of Cole-Cole plots illustrated in FIG. 9 with the third Cole-Cole plots calculated by the second calculation unit 44.

For example, RC in a battery cell having an SOH of 90% is 5.11 mΩ, and RC in a battery cell having an SOH of 80% is 6.25 mΩ. On the other hand, a reaction resistor (charge transfer resistor) RC in the third battery cell 13 is 5.79 mΩ. Therefore, a state of health SOH of the third battery cell 13 in the battery module 1A is calculated to be 84% by linear approximation.

Needless to say, a more highly accurate state of health is obtained by calculation using more information.

Third Embodiment

Figure 13:
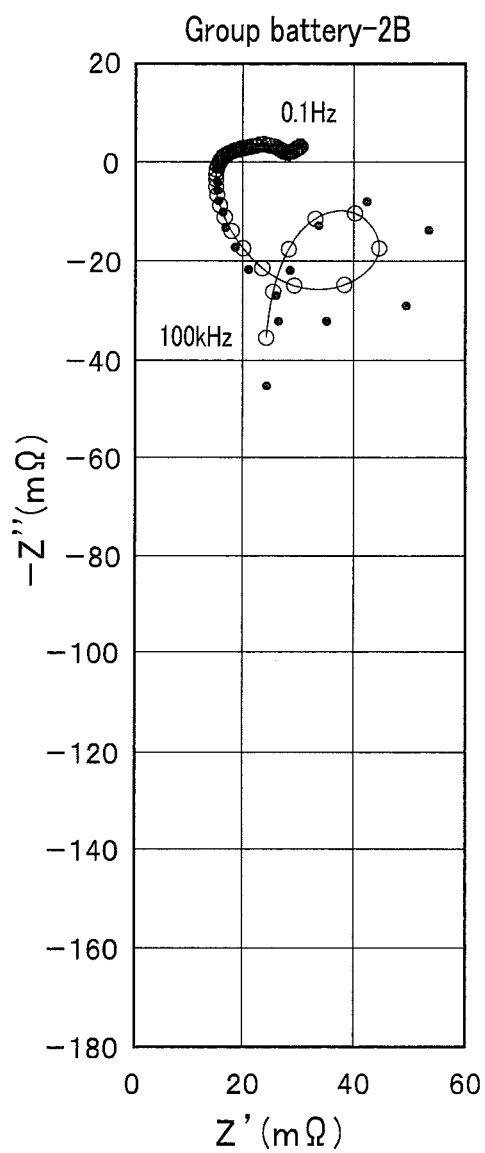
FIG. 13 illustrates a first Cole-Cole plot of a group battery in a battery module according to a third embodiment.

A first Cole-Cole plot (a frequency characteristic of an impedance) of a group battery 2B, which has been measured by a measurement unit 42 in a battery module 1B according to a third embodiment, is illustrated in FIG. 13. For reference, the first Cole-Cole plot of the group battery 2 in the battery module 1 (see FIG. 6) is indicated by black circles.

The first Cole-Cole plot of the group battery 2B is similar to but is smaller in size of a loop portion than the first Cole-Cole plot of the group battery 2. An absolute value of Z" at a measurement frequency of 100 kHz is small.

Figure 14C:
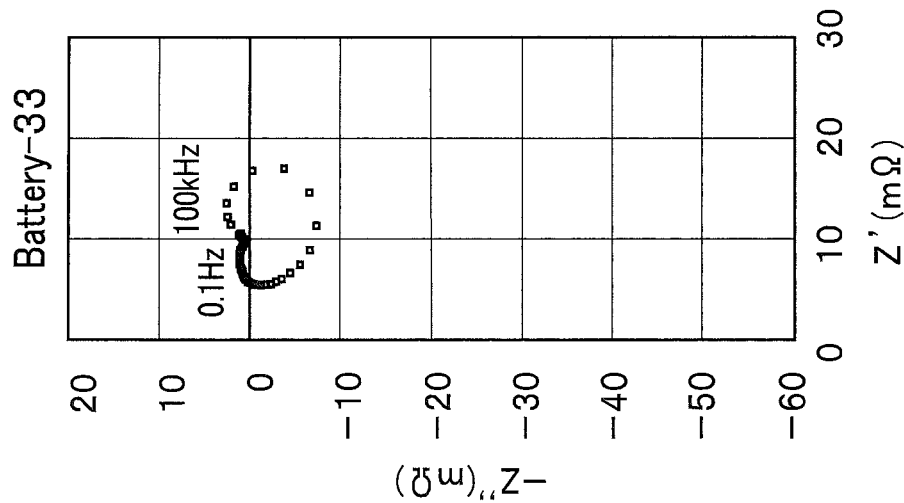
FIG. 14C illustrates a second Cole-Cole plot of a third battery in the battery module according to the third embodiment.
Figure 14B:
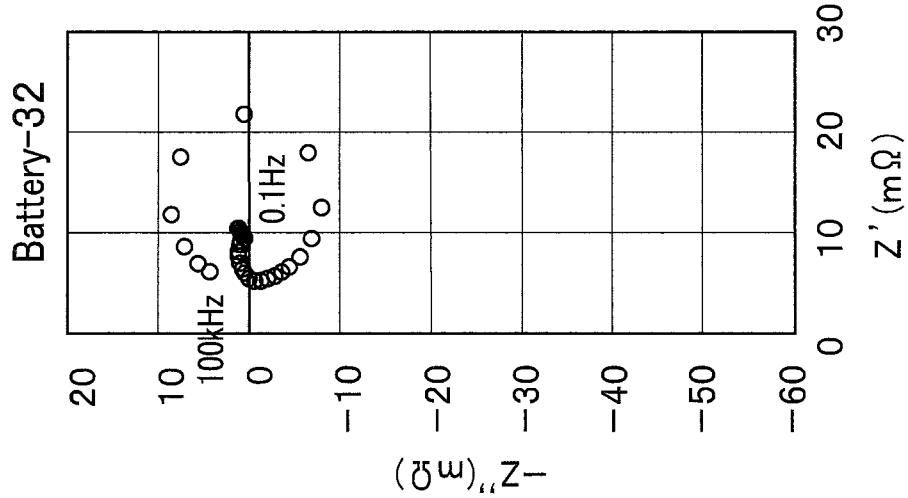
FIG. 14B illustrates a second Cole-Cole plot of a second battery in the battery module according to the third embodiment.
Figure 14A:
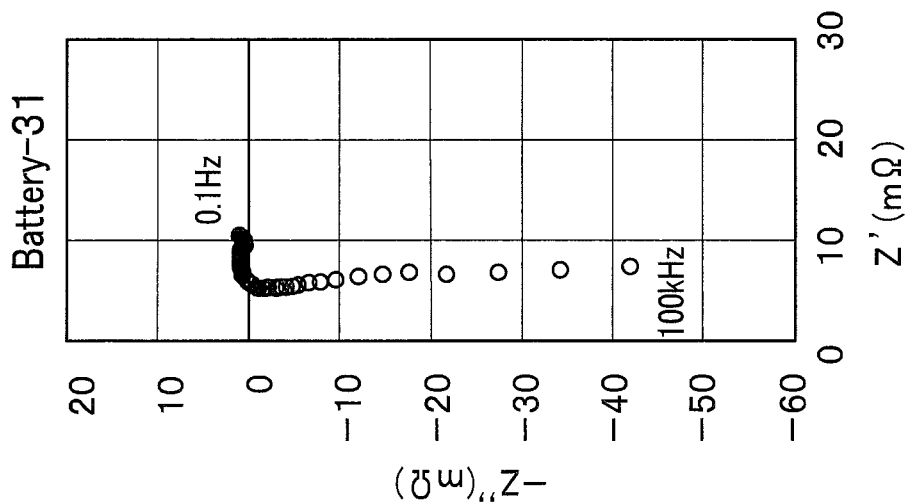
FIG. 14A illustrates a second Cole-Cole plot of a first battery in the battery module according to the third embodiment.

A first calculation unit 43 decomposes the first Cole-Cole plot into respective second Cole-Cole plots of batteries 31 to 33 illustrated in FIGS. 14A, 14B, and 14C.

The second Cole-Cole plot of the first battery 31 illustrated in FIG. 14A seems to be similar to but significantly differs in an impedance Z" having a high frequency, e.g., a frequency of 100 kHz from the second Cole-Cole plot of the first battery 31 in the group battery 2 (FIG. 7A). Similarly, the second Cole-Cole plots of the batteries 32 and 33 slightly differ from the second Cole-Cole plots of the batteries 32 and 33 in the group battery 2.

A second calculation unit 44 calculates respective third Cole-Cole plots of the plurality of battery cells 10 from the second Cole-Cole plots.

Figure 15A:
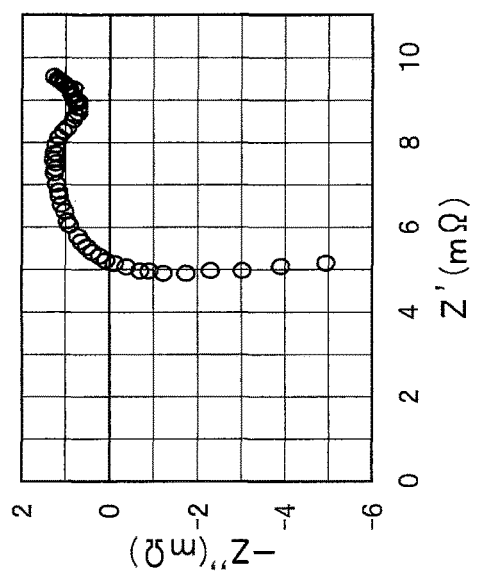
FIG. 15A illustrates a third Cole-Cole plot of a first battery cell in the battery module according to the third embodiment.
Figure 15B:
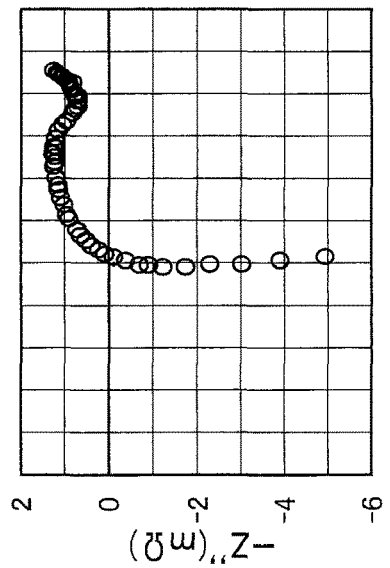
FIG. 15B illustrates a third Cole-Cole plot of a second battery cell in the battery module according to the third embodiment.
Figure 15C:
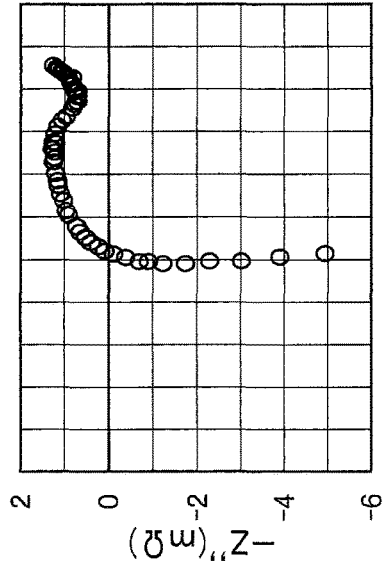
FIG. 15C illustrates a third Cole-Cole plot of a third battery cell in the battery module according to the third embodiment.

All the respective third Cole-Cole plots of the battery cells 11, 12, and 13 illustrated in FIGS. 15A, 15B, 15C are substantially the same as the third Cole-Cole plot of the third battery cell 13 having an SOH of 84% in the group battery 2A (FIG. 12C). Therefore, all respective states of health (SOH) of the battery cells 11, 12, and 13 in the battery module 1B are calculated to be 84%.

Fourth Embodiment

Figure 16:
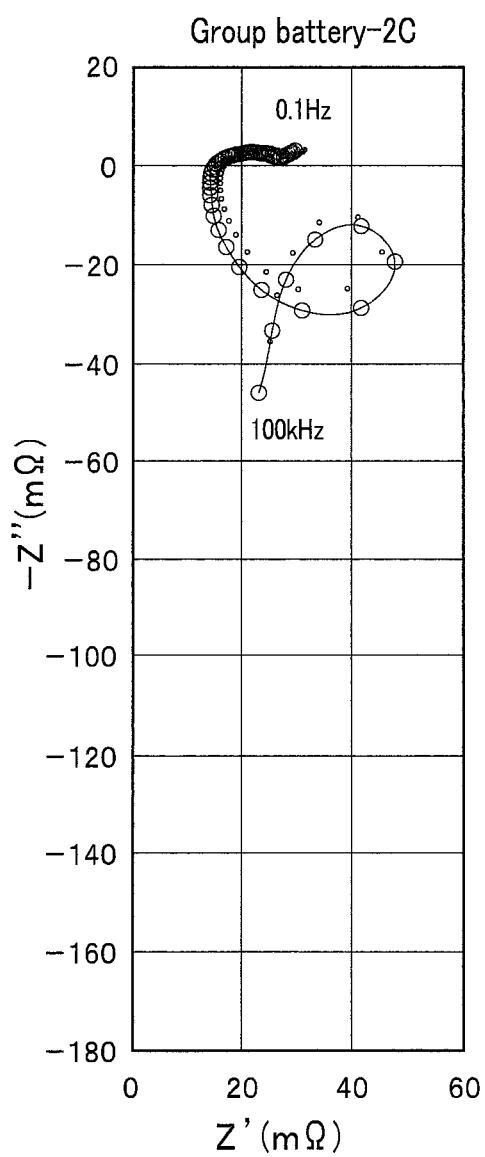
FIG. 16 illustrates a first Cole-Cole plot of a group battery in a battery module according to a fourth embodiment.

A first Cole-Cole plot (a frequency characteristic of an impedance) of a group battery 2C, which has been measured by a measurement unit 42 in a battery module 1C according to a fourth embodiment, is illustrated in FIG. 16. For reference, the first Cole-Cole plot of the group battery 2A in the battery module 1A (see FIG. 10) is indicated by small circles.

The first Cole-Cole plot of the group battery 2C is similar to but is slightly different in a position of a loop and a measurement value at a measurement frequency of 100 kHz from the first Cole-Cole plot of the group battery 2A in which only the third battery cell 13 has deteriorated.

Figure 17C:
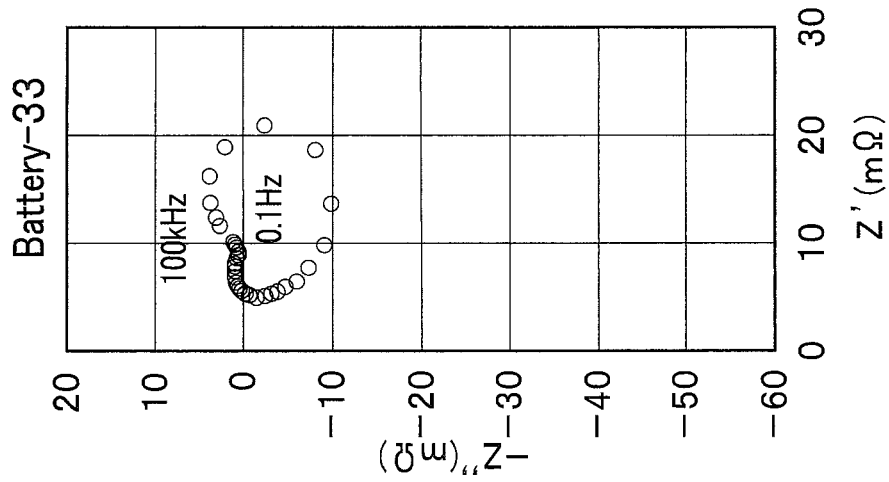
FIG. 17C illustrates a second Cole-Cole plot of a third battery in the battery module according to the fourth embodiment.
Figure 17B:
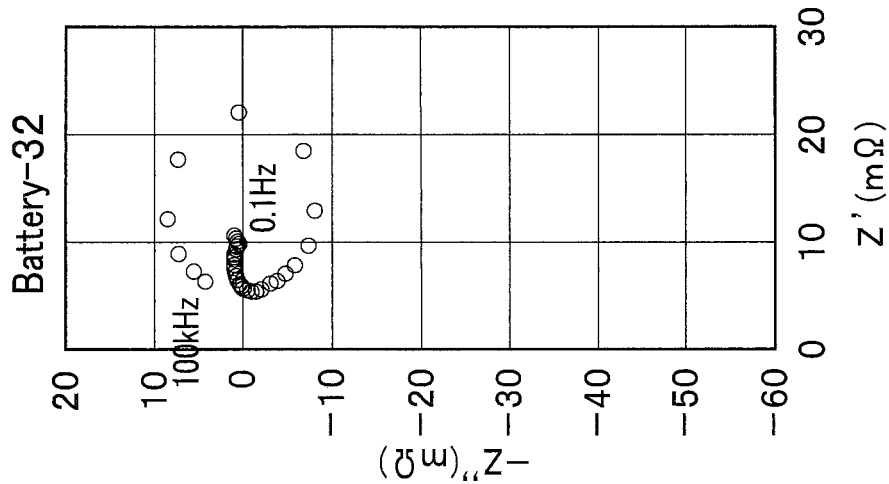
FIG. 17B illustrates a second Cole-Cole plot of a second battery in the battery module according to the fourth embodiment.
Figure 17A:
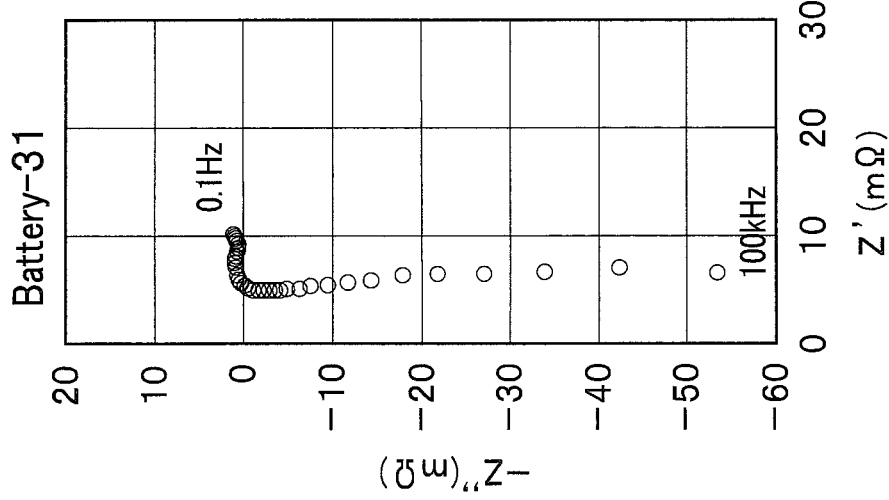
FIG. 17A illustrates a second Cole-Cole plot of a first battery in the battery module according to the fourth embodiment.

A first calculation unit 43 decomposes the first Cole-Cole plot into respective second Cole-Cole plots of batteries 31 to 33 illustrated in FIGS. 17A, 17B, and 17C.

The second Cole-Cole plot of the first battery 31 illustrated in FIG. 17A is the same as the second Cole-Cole plot of the first battery 31 in the group battery 2 (FIG. 7A). The second Cole-Cole plot of the third battery 33 illustrated in FIG. 17C is the same as the second Cole-Cole plot of the third battery 33 in the group battery 2 (FIG. 7C).

On the other hand, the second Cole-Cole plot of the second battery 32 illustrated in FIG. 17B differs from the second Cole-Cole plot of the second battery 32 in the group battery 2, and is the same as the second Cole-Cole plot of the second battery 32 in the group battery 2B (FIG. 14B).

A second calculation unit 44 calculates respective third Cole-Cole plots of battery cells 10 from the second Cole-Cole plots.

Figure 18A:
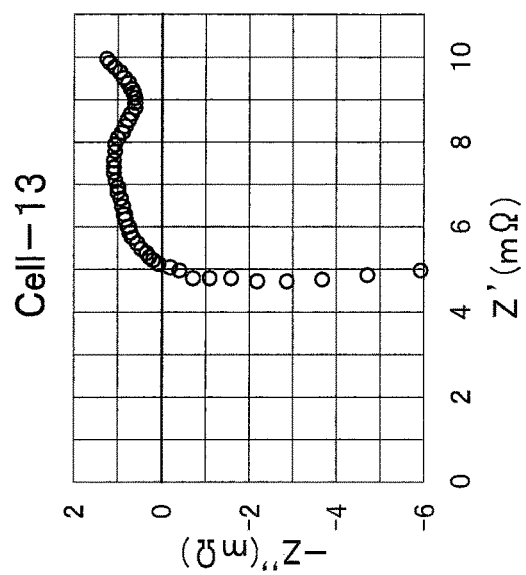
FIG. 18A illustrates a third Cole-Cole plot of a first battery cell in the battery module according to the fourth embodiment.
Figure 18B:
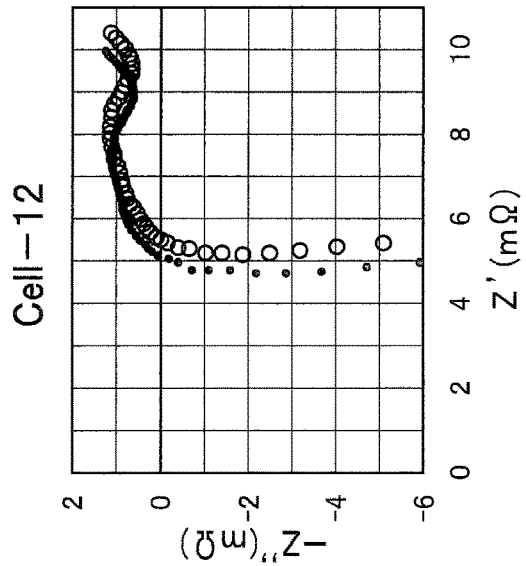
FIG. 18B illustrates a third Cole-Cole plot of a second battery cell in the battery module according to the fourth embodiment.
Figure 18C:
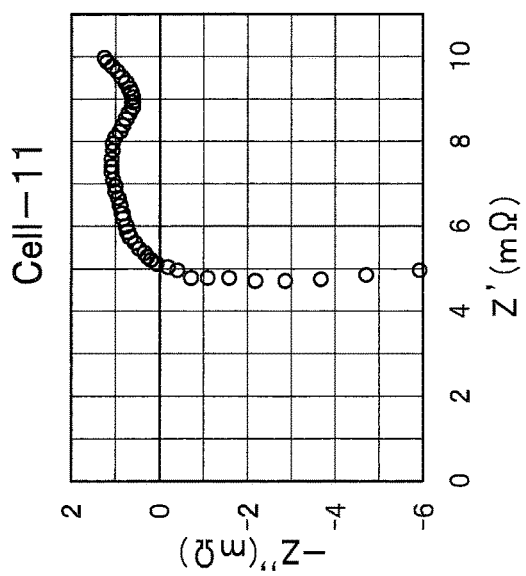
FIG. 18C illustrates a third Cole-Cole plot of a third battery cell in the battery module according to the fourth embodiment.

The respective third Cole-Cole plots of the battery cells 11 and 13 illustrated in FIGS. 18A and 18C are the same as the Cole-Cole plot (an SOH of 100%). Therefore, a third calculation unit 45 calculates respective states of health (SOH) of the battery cells 11 and 13 in the battery module 1C to be 100%.

On the other hand, the third Cole-Cole plot of the battery cell 12 illustrated in FIG. 18B differs from the third Cole-Cole plot (an SOH of 100%) indicated by small circles, and is the same as the second Cole-Cole plot (an SOH of 84%) of the third battery cell 13 in the group battery 2A. That is, the state of health (SOH) of the second battery cell 12 in the battery module 1C is calculated to be 84%.

Fifth Embodiment

Figure 19:
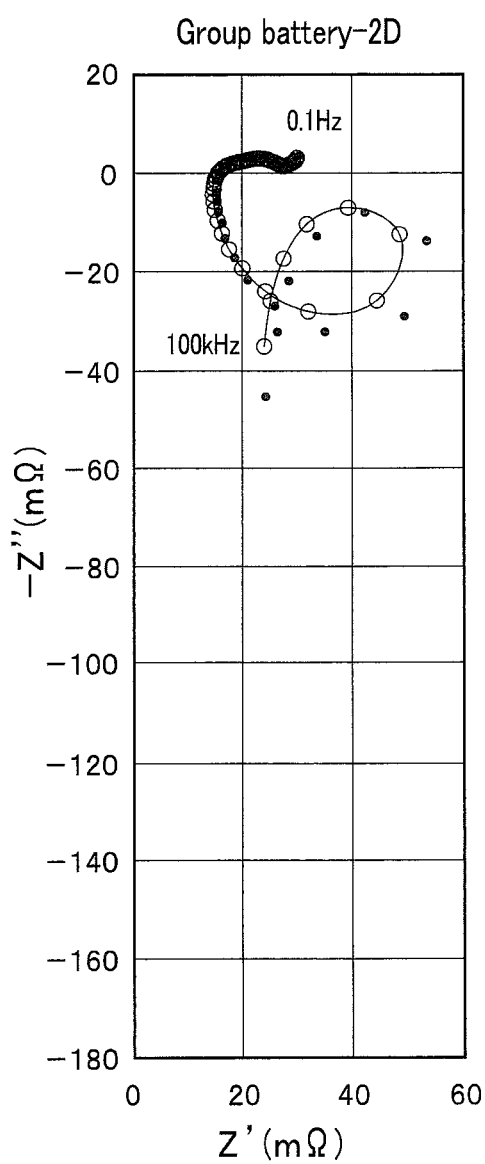
FIG. 19 illustrates a first Cole-Cole plot of a group battery in a battery module according to a fifth embodiment.

A first Cole-Cole plot (a frequency characteristic of an impedance) of a group battery 2D, which has been measured by a measurement unit 42 in a battery module 1D according to a fifth embodiment, is illustrated in FIG. 19. For reference, the first Cole-Cole plot of the group battery 2 in the battery module 1 (see FIG. 6) is indicated by small circles.

Figure 20A:
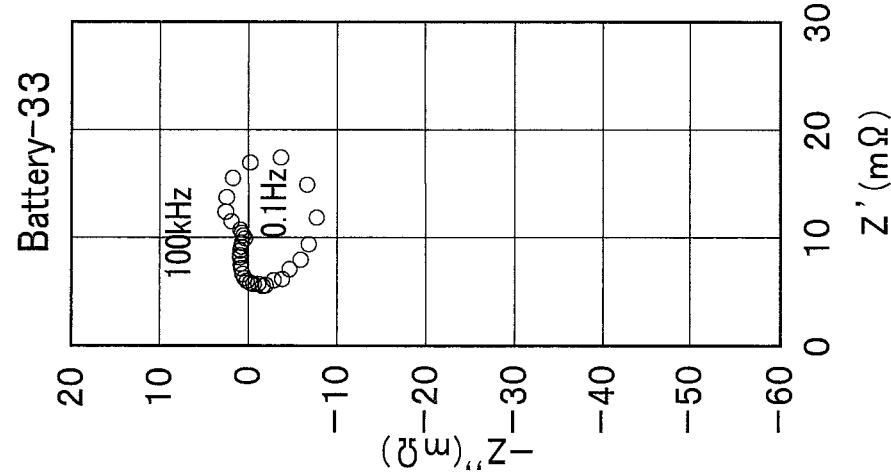
FIG. 20A illustrates a second Cole-Cole plot of a first battery in the battery module according to the fifth embodiment.
Figure 20B:
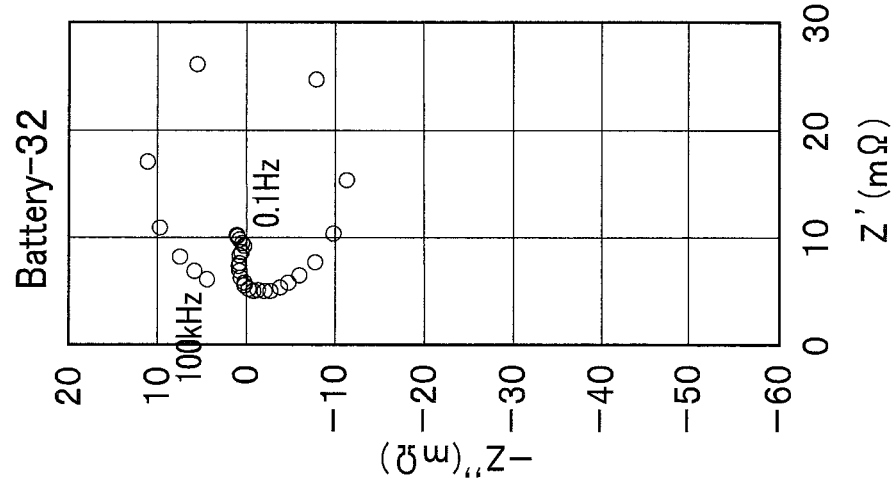
FIG. 20B illustrates a second Cole-Cole plot of a second battery in the battery module according to the firth embodiment.
Figure 20C:
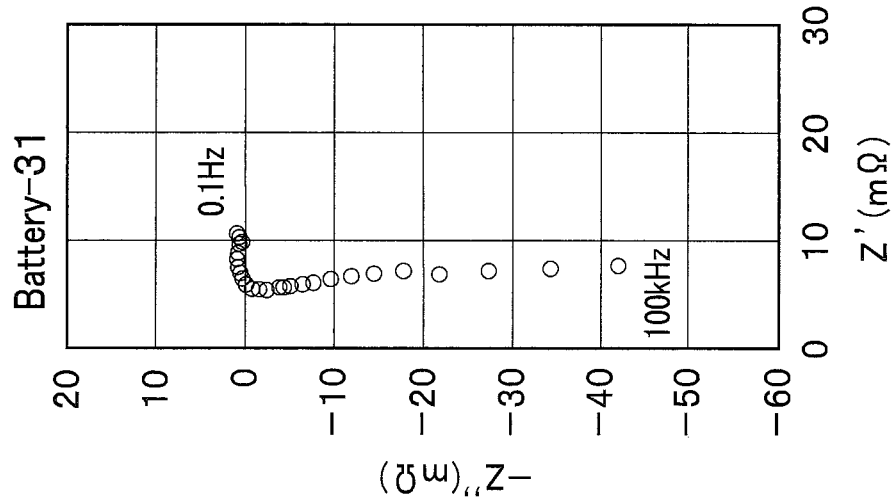
FIG. 20C illustrates a second Cole-Cole plot of a third battery in the battery module according to the fifth embodiment.

A first calculation unit 43 decomposes the first Cole-Cole plot into respective second Cole-Cole plots of batteries 31 to 33 illustrated in FIGS. 20A, 20B, and 20C.

A second calculation unit 44 calculates respective third Cole-Cole plots of battery cells 10 from the second Cole-Cole plots.

The second Cole-Cole plots of the batteries 31 and 33 illustrated in FIGS. 20A and 20C are respectively the same as the second Cole-Cole plots of the batteries 31 and 33 in the group battery 2B. On the other hand, the second Cole-Cole plot of the second battery 32 illustrated in FIG. 20B is the same as the second Cole-Cole plot of the second battery 32 in the group battery 2.

Figure 21A:
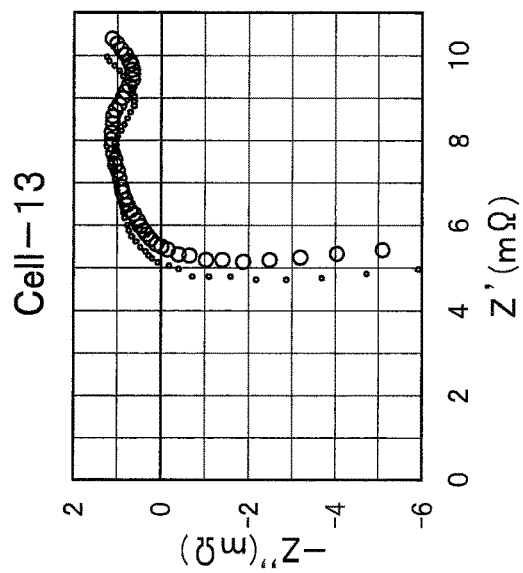
FIG. 21A illustrates a third Cole-Cole plot of a first battery cell in the battery module according to the fifth embodiment.
Figure 21B:
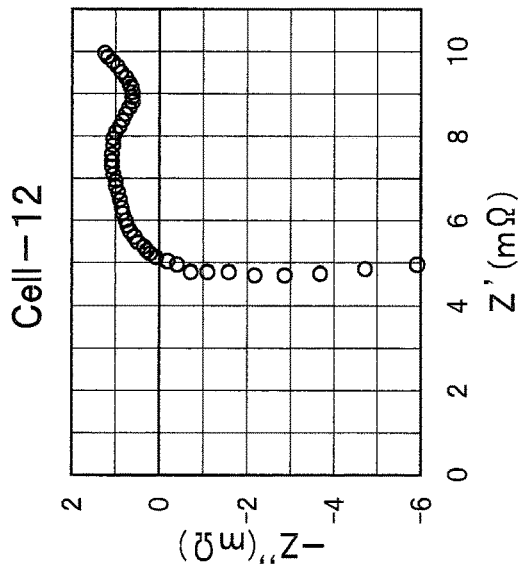
FIG. 21B illustrates a third Cole-Cole plot of a second battery cell in the battery module according to the fifth embodiment.
Figure 21C:
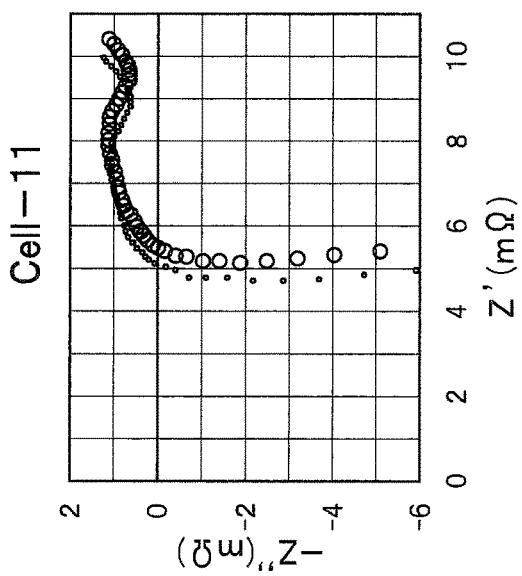
FIG. 21C illustrates a third Cole-Cole plot of a third battery cell in the battery module according to the fifth embodiment.

The respective third Cole-Cole plots of the battery cells 11 and 13 illustrated in FIGS. 21A and 21C, which have been calculated by the second calculation unit 44, are the same as the third Cole-Cole plot (an SOH of 84%) of the third battery cell 13 in the group battery 2B. On the other hand, the second Cole-Cole plot of the battery cell 12 illustrated in FIG. 21B is the same as the Cole-Cole plot (an SOH of 100%).

Therefore, a third calculation unit 45 calculates respective states of health of the battery cells 11 and 13 in the battery module 1D to be 84%, and calculates a state of health (SOH) of the battery cell 12 to be 100%.

Sixth Embodiment

Figure 22:
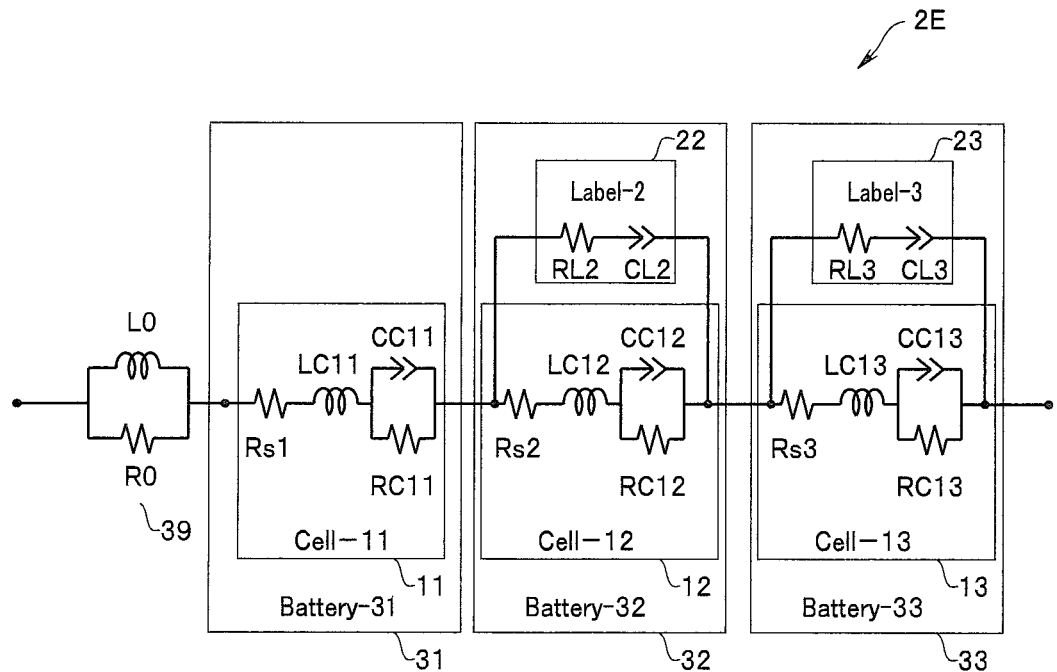
FIG. 22 is an equivalent circuit diagram of a group battery in a battery module according to a sixth embodiment.

An equivalent circuit model of a group battery 2E in a battery module 1E according to a sixth embodiment is illustrated in FIG. 22. As illustrated in FIG. 22, respective inductance components (LC) of the battery cells 10 are considered in the present embodiment.

For example, each of the battery cells 10 has the inductance component in a range of $10^{-9}$H to $10^{-5}$H, which is ignored in a normal equivalent circuit model. The battery cell 10 with which label element 20 is connected in parallel constitutes an LC resonance circuit having a resonance frequency FR of $1/(2\pi SQR(LC))$ by selecting a value of a capacitance component (C) of the label element 20 for an inductance L of the inductance component. Note that SQR (X) means a square root of X.

The resonance frequency FR changes depending on the value of the capacitance component of the label element 20. Accordingly, when a capacitance of the label element 20 connected to each of battery cells 10 is changed, to change respective resonance frequencies FR of a plurality of batteries, differences among respective impedance characteristics (Cole-Cole plots) of the plurality of batteries 30 become large, and a first calculation step for decomposing a first Cole-Cole plot of the group battery 2E into respective second Cole-Cole plots of the plurality of batteries 30 becomes easy.

If the inductance component of the battery cell 10 is 10-7H, for example, a resonance frequency FR of the second battery 32 with which a label element 22 having a capacitance of 100 µF is connected in parallel is 50 kHz, and a resonance frequency FR of the third battery 33 with which a label element 23 having a capacitance of 1000 µF is connected in parallel becomes 16 kHz. That is, the batteries 31, 32 and 33 to which the label elements 22 and 23 are respectively connected among the batteries 30, 31, and 32 enter a resonance mode in a high-frequency region (an inductance region C) having a frequency of 10 kHz or more, whereby differences among the impedance characteristics (Cole-Cole plots) of the batteries become large.

The inductance component of the battery cell 10 is not large. Accordingly, to set the resonance frequency FR to not less than 10 kHz nor more than 100 kHz, the capacitance CL of the label element 20 is preferably 50 µF or more and preferably 200 µF or more in particular. Note that an upper limit of the capacitance CL is 1000 µF, for example, which can be implemented at low cost.

That is, in the label elements 20 configured such that the respective impedance characteristics of the plurality of batteries 30 differ from one another, capacitances are preferably set such that the batteries 30 respectively enter resonance modes in predetermined frequency bands which differ from one another. A resonance frequency difference is preferably 2 kHz or more and preferably 10 kHz or more in particular, for example. However, the larger the resonance frequency difference is, the easier a first calculation step becomes but the wider a frequency band required to be measured becomes. Therefore, the resonance frequency difference is preferably 100 kHz or less, for example.

Note that, when the label elements 20 each have a resistance component in addition to a capacitance component, an impedance can be changed in a wide frequency band centered at a resonance frequency. Conversely, an influence of resonance decreases due to the resistance component. Therefore, the label elements 20 can also be configured such that the respective impedance characteristics of the plurality of batteries 30 differ from one another depending on whether the influence of the resonance is large or small even at the same resonance frequency.

ADDITIONAL NOTES

As already described, an equivalent circuit model for analyzing a Cole-Cole plot of a battery cell is not limited to a simple model illustrated in FIG. 4.

Figure 23:
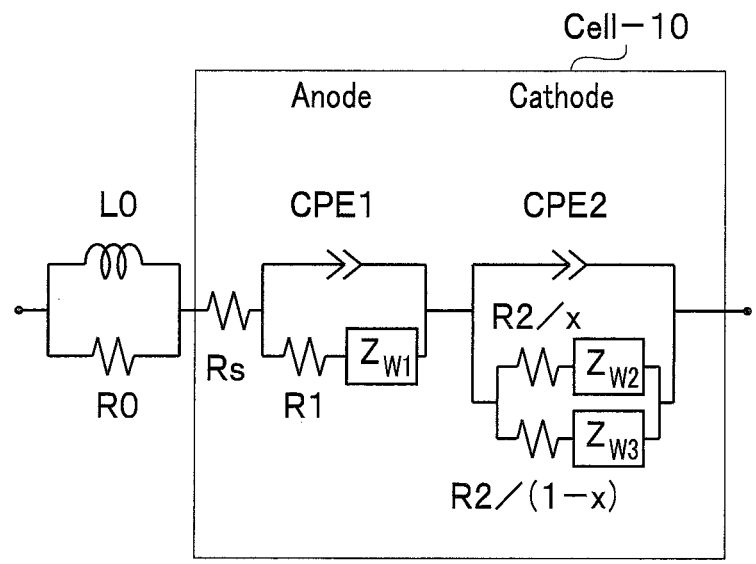
FIG. 23 illustrates an example of an equivalent circuit diagram of a battery.

For example, the equivalent circuit model illustrated in FIG. 23 considers an anode and a cathode, and includes a measurement circuit (an inductance L0 and a resistor R0), a solution resistor Rs, (a capacitor CPE1, a resistor R1, and a diffusion resistor Zw1), a circuit 33 (a capacitor CPE2, a resistor R2/x, a resistor R2(1-x), and diffusion resistors Zw2 and Zw3).

Figure 24:
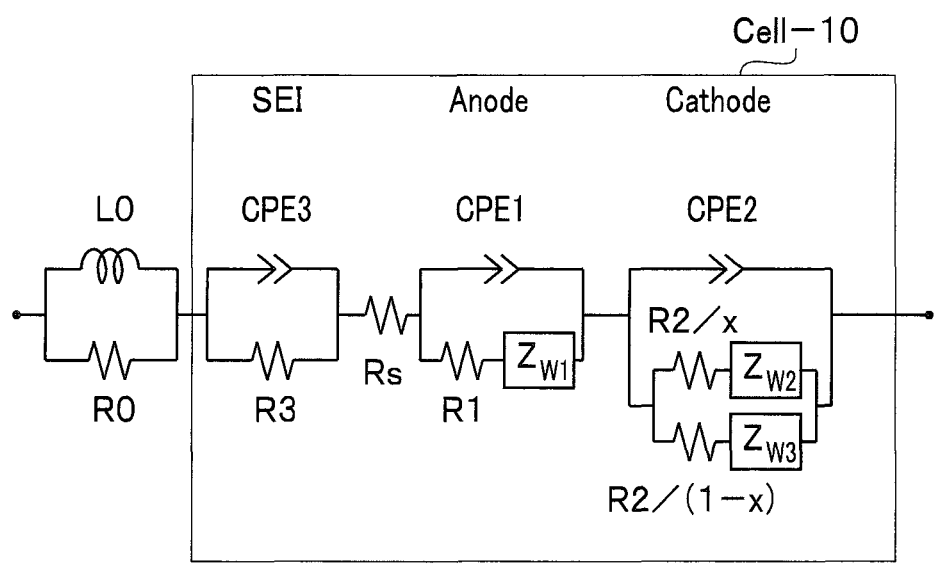
FIG. 24 illustrates an example of an equivalent circuit diagram of a battery.

A solid electrolyte interphase circuit (a capacitor CPE3 and a resistor R3) is further added to an equivalent circuit model illustrated in FIG. 24.

The present invention is not limited to the above-described embodiments, and various changes and alterations, for example, combinations of components in the embodiments can be made without departing from the scope and spirit of the present invention.

This application claims the benefit of Japanese Patent Application No. 2017-077004 filed in Japan on Apr. 7, 2017, the contents of which are incorporated in the specification, claims, and drawings by reference.

REFERENCE SIGNS LIST 1, 1A to 1D . . . Battery module
2, 2A to 2D . . . Group battery
3 . . . Assessment evaluation unit
10 (11, 12, 13) . . . Battery cell
10A . . . Anode
10B . . . Electrolyte
10C . . . Separator
10D . . . Cathode
20 (22, 23) . . . Label element
30 (31, 32, 33) . . . Battery
39 . . . Measurement system
41 . . . Control unit
42 . . . Measurement unit
43 . . . First calculation unit
44 . . . Second calculation unit
45 . . . Third calculation unit
46 . . . Storage unit

The invention claimed is:

1. A battery system comprising:
a group battery comprising batteries connected in series, wherein N≥2, and wherein each of the N batteries includes a battery cell of a plurality of battery cells; and
a processor configured to calculate respective states of the plurality of battery cells, wherein at least (N−1) of the N batteries respectively include a plurality of label elements, wherein each label element of the plurality of label elements is connected in parallel with a battery cell of the plurality of battery cells, wherein the plurality of label elements are configured to cause respective impedance characteristics of the N batteries to differ from one another, and wherein the processor is further configured to:
measure a first Cole-Cole plot as an impedance characteristic of the group battery;
decompose the first Cole-Cole plot into a plurality of respective second Cole-Cole plots of the N batteries;
eliminate respective influences of impedance characteristics of the label elements from the plurality of second Cole-Cole plots to calculate a plurality of respective third Cole-Cole plots of the plurality of battery cells; and
calculate respective states of the plurality of battery cells based on the plurality of third Cole-Cole plots.

2. The battery system of claim 1, wherein the respective impedance characteristics of the N batteries differ from one another in a frequency band of 10 kHz or more.

3. The battery system of claim 2, wherein each of the plurality of label elements includes a capacitance component having a capacitance which is 50% or more of a capacitance of the battery cell.

4. The battery system of claim 2, wherein each of the plurality of label elements includes a capacitance component having a capacitance which is 50% or more of a capacitance of an associated battery cell of the plurality of battery cells, and a resistance component having a direct-current resistance which is 10% or more of a resistance of the associated battery cell, and wherein respective direct-current resistances of the plurality of label elements differ from one another by 25% or more.

5. The battery system of claim 1, wherein each of the plurality of label elements includes a capacitance component, and the N batteries to which the plurality of label elements are connected respectively enter resonance modes in a predetermined frequency band so that impedance characteristics of the N batteries differ from one another.

6. The battery system of claim 5, wherein the predetermined frequency band is 10 kHz or more.

7. The battery of claim 5, wherein the plurality of label elements includes a resistance component.

8. The battery system of claim 1, wherein the processor decomposes the first Cole-Cole plot into the second Cole-Cole plots using a curve fitting algorithm while changing parameters of an equivalent circuit model based on the second Cole-Cole plots of the plurality of battery cells or a plurality of states of the N battery cells.

9. A method for evaluating a battery system, the method comprising:
acquiring a first Cole-Cole plot of a group battery comprising N(N≥2) batteries connected in series, wherein each of the N batteries includes a battery cell of a plurality of battery cells and at least one of a plurality of label elements, wherein the plurality of label elements are connected in parallel with at least (N−1) of the N batteries, wherein the plurality of label elements are configured such that to cause respective impedance characteristics of the N batteries to differ from one another;
decomposing the first Cole-Cole plot into respective second Cole-Cole plots of the N batteries;
eliminating respective influences of impedance characteristics of the plurality of label elements from the second Cole-Cole plots to calculate respective third Cole-Cole plots of the plurality of battery cells; and
calculating respective states of the plurality of battery cells based on the third Cole-Cole plots.

* * * * *